United States Patent
Ozaki et al.

(10) Patent No.: US 7,180,223 B2
(45) Date of Patent: Feb. 20, 2007

(54) SURFACE ACOUSTIC WAVE DEVICE

(75) Inventors: Kyosuke Ozaki, Miyagi-ken (JP);
Makoto Sasaki, Miyagi-ken (JP);
Haruhiko Fujimoto, Gunma-ken (JP);
Satoshi Waga, Miyagi-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 144 days.

(21) Appl. No.: 11/050,064

(22) Filed: Feb. 3, 2005

(65) Prior Publication Data
US 2005/0174012 A1 Aug. 11, 2005

(30) Foreign Application Priority Data
Feb. 6, 2004 (JP) ............................. 2004-030211
May 18, 2004 (JP) ............................. 2004-147241

(51) Int. Cl.
*H01L 41/08* (2006.01)
(52) U.S. Cl. ................. 310/313 A; 310/313 B; 310/364
(58) Field of Classification Search ............ 310/313 A, 310/313 B, 313 R, 363, 364
See application file for complete search history.

(56) References Cited

U.S. PATENT DOCUMENTS

| | | | |
|---|---|---|---|
| 5,500,329 A * | 3/1996 | Kawai et al. ............... 430/363 |
| 6,297,580 B1 | 10/2001 | Takayama et al. |
| 6,542,285 B1 * | 4/2003 | Batchko et al. ............. 359/326 |
| 6,630,767 B2 | 10/2003 | Inoue et al. |

FOREIGN PATENT DOCUMENTS

JP 2002-305425 10/2002

* cited by examiner

*Primary Examiner*—Mark Budd
(74) *Attorney, Agent, or Firm*—Brinks Hofer Gilson & Lione

(57) ABSTRACT

There is provided a surface acoustic wave device which can prevent a breakage of electrodes and electrical breaks, decrease an insertion loss of elements, and enhance a Q-factor of resonators. Interdigital electrode sections and each have a laminated structure of a base layer made of TiN (titanium nitride) or $TiO_xN_y$, and a main electrode layer deposited to come in contact with an upper surface of the base layer. The main electrode layer is deposited such that a {111} plane as a closest-packed plane of the main electrode layer has a constant gradient with respect to a surface of a substrate, and thus electromigration or stress migration can be suppressed in the interdigital electrode sections.

18 Claims, 38 Drawing Sheets

Cu ALLOY LAYER
Ti BASE LAYER
PIEZOELECTRIC SUBSTRATE

SURFACE ACOUSTIC WAVE DEVICE

This application claims the benefit of priority to Japanese Patent Application Nos. 2004-030211 filed on Feb. 6, 2004 and 2004-147241 filed on May 18, 2004, both herein incorporated by reference.

BACKGROUND OF THE INVENTION

1. Field of the Invention

The present invention relates to a surface acoustic wave device having an electrode structure with high withstand power at high frequencies.

2. Description of the Related Art

Surface acoustic wave devices are electronic components using surface acoustic waves, which are mechanical vibrations propagating along surfaces of solid materials, and they are used for filters, resonators, or duplexers.

Recently, the miniaturization of mobile communication terminals such as cellular phones has been advancing. Therefore, electronic components of such terminals must be reduced in size.

A surface acoustic wave device has a piezoelectric substrate and a pair of interdigital electrodes (interdigital transducer (IDT) electrodes), disposed thereon, made of a conductive material. Each interdigital electrode has electrode fingers that are alternatively arranged. The surface acoustic wave device having such a simple structure is suitable for filters, resonators, and duplexers that must be reduced in size when used for such mobile communication terminals.

A known surface acoustic wave device usually includes interdigital electrodes made of aluminum (Al) or an aluminum alloy having high conductivity and low density.

When such a surface acoustic wave device is used as, for example, an antenna duplexer placed in a radio frequency (RF) section which is placed downstream a transmitting amplifier and to which high voltage is applied, the surface acoustic wave device must have high withstand power. Further, since the mobile communication terminals have recently used higher frequencies, the operating frequency of the surface acoustic wave device must be increased from several hundred MHz to several GHz.

In order to increase the frequency, the electrode fingers of the interdigital electrodes of the surface acoustic wave device must be reduced in size and pitch between the electrode fingers. For example, band pass filters with a center frequency of 2 GHz must have a width of about 0.5 µm and band pass filters with a center frequency of 10 GHz must have a width of about 0.1 µm.

When high-voltage signals are applied to the interdigital electrodes having such fine electrode fingers, the interdigital electrodes suffer from strong stress due to surface acoustic waves. Stress exceeding the critical stress of the interdigital electrodes causes electromigration or stress migration. The electromigration or stress migration carries metal atoms contained in the interdigital electrodes to migrate through grain boundaries or stable faces of crystals and thereby voids are formed in the interdigital electrodes or hillocks are formed thereon. The electromigration or stress migration causes a breakage of the electrodes, electrical breaks, an increase in insertion loss of elements, a decrease in Q-factor of resonators, and the like, and finally causes deterioration of the surface acoustic wave device.

The known surface acoustic wave devices, disclosed in Japanese Unexamined Patent Application Publication No. 2002-305425 and U.S. Pat. No. 6,630,767, have an Al electrode layer having a twin crystal structure in which a base layer made titanium (Ti) is formed below an interdigital electrode section made of Al or an Al alloy, thereby enhancing withstand power.

When the base layer made of Ti is formed below the interdigital electrode section made of Al or the Al alloy, the orientation in a specific direction of the {111} plane of the Al layer or Al alloy layer is weakened and the electromigration or stress migration is apt to occur in the surface acoustic wave device. This causes a breakage of the electrodes, electrical breaks, an increase in insertion loss of elements, a decrease in Q-factor of resonators, and the like, and finally causes deterioration of the surface acoustic wave device.

Further, oxygen atoms of the piezoelectric substrate diffuse into the base Ti layer, or the Al layer or Al alloy layer. Therefore, there is a problem in that the electrical resistance of the interdigital electrode section becomes large, thereby increasing the insertion loss of elements.

U.S. Pat. No. 6,297,580 discloses a technique in which a layer made of TiN is formed below a layer made of an Al alloy. However, in this prior art, an example of a surface acoustic wave device, in which the layer made of TiN is formed below the layer made of the Al alloy, and the rules for liquid crystal orientation are not disclosed.

SUMMARY OF THE INVENTION

The present invention has been made in order to solve the problems in the prior arts, and it is an object of the present invention to provide a surface acoustic wave device which can enhance withstand power.

There is provided a surface acoustic wave device according to the present invention which has a piezoelectric substrate and an electrode section having a thin-film structure formed on the piezoelectric substrate. The electrode section has an interdigital electrode section and a junction electrode section connected to the interdigital electrode section. The interdigital electrode section has a base layer and a main electrode layer deposited on the base layer. The base layer has a rock-salt structure crystal structure, a face-centered cubic or a hexagonal closest-packed crystal structure, and the main electrode layer has a face-centered cubic crystal structure. A {111} plane of the main electrode layer has a constant gradient with respect to the substrate surface.

According to the present invention, the main electrode layer of the face-centered cubic structure is deposited on the base layer of the rock-salt structure, the face-centered cubic structure, or the hexagonal closest-packed structure such that the {111} plane as a closest-packed plane of the main electrode layer has the constant gradient with respect to the substrate surface. Thus, the electromigration or stress migration can be suppressed. As a result, an electrode breakage and electrical breaks can be prevented, an insertion loss of elements can be decreased, and a Q-factor of resonators can be increased. Therefore, properties of the surface acoustic wave device can be enhanced.

Further, when the {111} plane of the main electrode layer is parallel to an X-axis of crystals of the piezoelectric substrate, the {111} plane as the closest-packed plane crosses an amplitude direction of shear horizontal (SH) waves. Thus, resistance to electromigration or stress migration can be enhanced.

Further, a {111} plane of the base layer preferably has a constant gradient with respect to the substrate surface.

Further, in the present invention, preferably, crystals of the main electrode layer are epitaxially or heteroepitaxially grown on crystals of the base layer. At this time, a spot position of the {111} plane in an X-ray diffraction (XRD) pole figure of the crystals of the main electrode layer is aligned with a spot position of the {111} plane in a XRD pole figure of the crystals of the base layer.

In the present invention, the pitch of the nearest neighbor atoms of the crystals of the base layer is preferably in a range of from 2.40 Å to 3.30 Å.

Further, the pitch of the nearest neighbor atoms of the crystals of the main electrode layer is preferably in a range of from 2.50 Å to 3.00 Å.

Further, a mismatch ratio between the pitch of the nearest neighbor atoms of the crystals of the base layer and the pitch of the nearest neighbor atoms of the crystals of the main electrode layer is preferably in a range of from −20% to 20%. More preferably, the mismatch ratio is in a range of from −15% to 15%.

As for the mismatch ratio, an expression of the mismatch ratio=(pitch of the nearest neighbor atoms of the crystals of the base layer−pitch of the nearest neighbor atoms of the crystals of the main electrode layer)×100/(pitch of the nearest neighbor atoms of the crystals of the main electrode layer) should be satisfied.

The base layer is formed with one or more of, for example, TiN (titanium nitride), $TiO_xN_y$ (where 0<x<0.2, x+y=1), nickel (Ni), iron (Fe), magnesium (Mg), cobalt (Co), or osmium (Os).

Further, the main electrode layer is formed with one or more selected from the group consisting of copper (Cu), aluminum (Al), platinum (Pt), gold (Au), and silver (Ag).

Alternatively, the main electrode layer may be formed with an alloy of one or more selected from the group consisting of Cu, Al, Pt, Au, and Ag and one or more selected from the group consisting of Ag, tin (Sn), carbon (C), scandium (Sc), and Cu.

In the present invention, the piezoelectric substrate may use one having a trigonal crystal structure. As a preferable material for the piezoelectric substrate, $LiTaO_3$ or $LiNbO_3$ may be used.

Further, when the piezoelectric substrate is made of $LiTaO_3$ having a Y-cut angle ranging from 36° to 60°, resonance property of the surface acoustic wave device is enhanced.

When the main electrode layer is formed with Al or an Al alloy, or Cu or a Cu alloy and the piezoelectric substrate is made of $LiTaO_3$ having the Y-cut angle ranging from 36° to 48°, an angle from a substrate normal direction in a [111] direction of the crystals of the main electrode layer becomes larger than an angle from the substrate normal direction in a Z-axis of the piezoelectric substrate.

Further, when a protective layer made of TiN (titanium nitride) or $TiO_xN_y$ (where 0<x<0.2, x+y=1) is deposited on the main electrode layer, the crystal structure of the main electrode layer can be stabilized and resistance to electromigration or stress migration can be enhanced.

The film thickness of the base layer is preferably in a range of from 5 nm to 20 nm.

According to the present invention, the main electrode layer of the face-centered cubic structure is deposited on the base layer of the rock-salt structure, the face-centered cubic structure, or the hexagonal closest-packed structure such that the {111} plane as the closest-packed plane of the main electrode layer has the constant gradient with respect to the substrate surface. Thus, the electromigration or stress migration can be suppressed. As a result, even if the operating frequency of the surface acoustic wave device increases from several hundred MHz to several GHz, the electrode breakage and the electrical breaks can be prevented, the insertion loss of elements can be decreased, and the Q-factor of resonators can be enhanced. Therefore, the properties of the surface acoustic wave device can be enhanced.

DESCRIPTION OF THE PREFERRED EMBODIMENT

Figure 1:
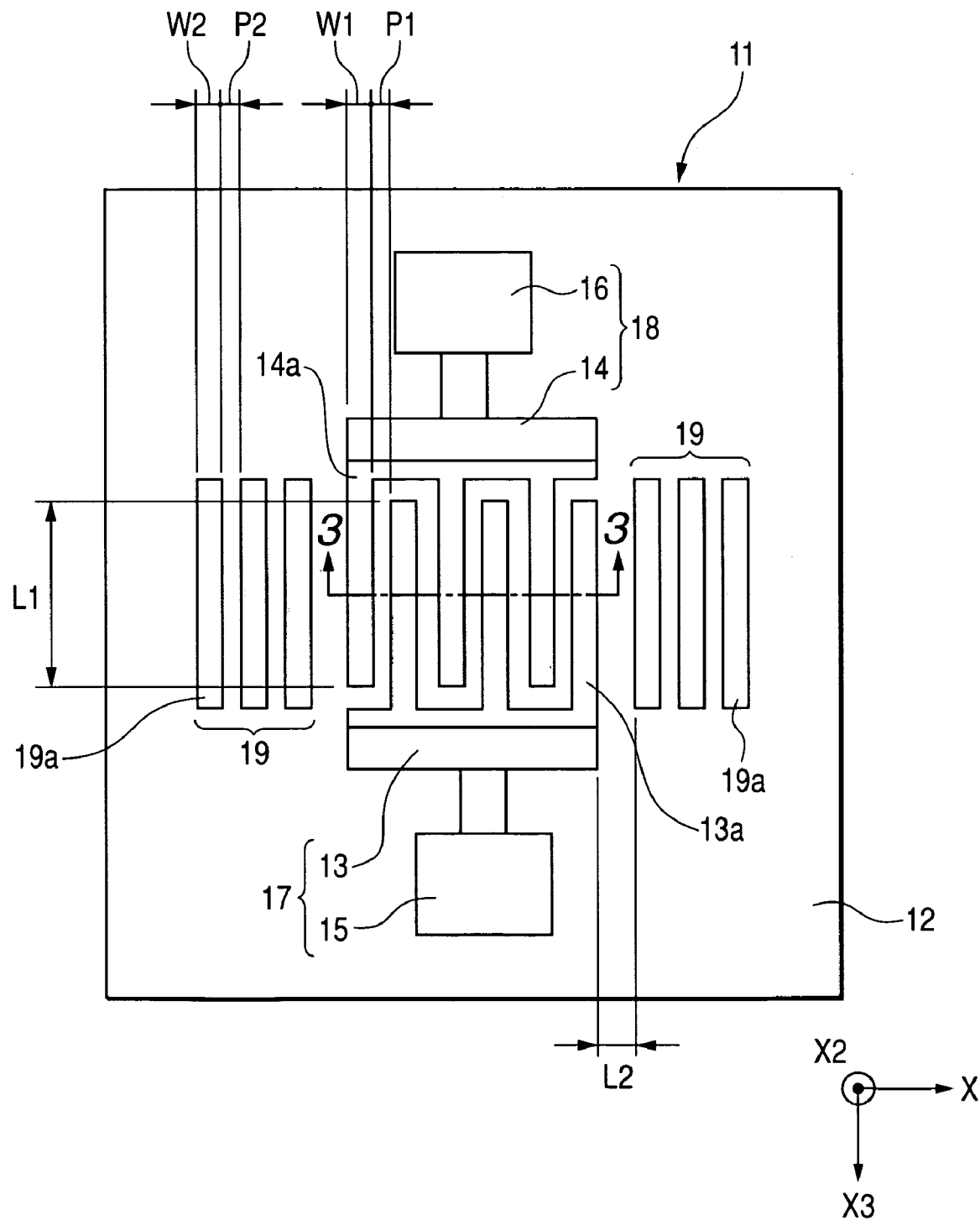
FIG. 1 is a plan view of a surface acoustic wave device according to an embodiment of the present invention.

FIG. 1 is a plan view showing a surface acoustic wave device according to an embodiment of the present invention. Reference numeral 11 represents the surface acoustic wave device, which functions as a branching filter. Reference numeral 12 represents a piezoelectric substrate. In the present embodiment, the piezoelectric substrate 12 is formed with a piezoelectric ceramic material such as LiTaO$_3$ or LiNbO$_3$ having a trigonal crystal structure.

On the piezoelectric substrate 12, an interdigital electrode section 13 and an interdigital electrode section 14 are formed. In the interdigital electrode sections 13 and 14, electrode fingers 13a extending in reverse to an X3 direction shown in FIG. 1 and electrode fingers 14a extending in the X3 direction are formed, respectively. The electrode fingers 13a of the interdigital electrode section 13 and the electrode fingers 14a of the interdigital electrode section 14 are alternately arranged at predetermined intervals in an X direction shown in FIG. 1.

Further, to the interdigital electrode section 13 and the interdigital electrode section 14, junction electrode sections 15 and 16, which are used for connecting the surface acoustic wave device to an external circuit, are electrically connected. The interdigital electrode section 13 and the junction electrode section 15 form an electrode section 17, and the interdigital electrode section 14 and the junction electrode section 16 form an electrode section 18.

Further, reflective electrodes 19 and 19 are arranged adjacent to and in the X direction and in reverse to the X direction with the interdigital electrode section 13 and the interdigital electrode section 14, respectively.

Figure 2:
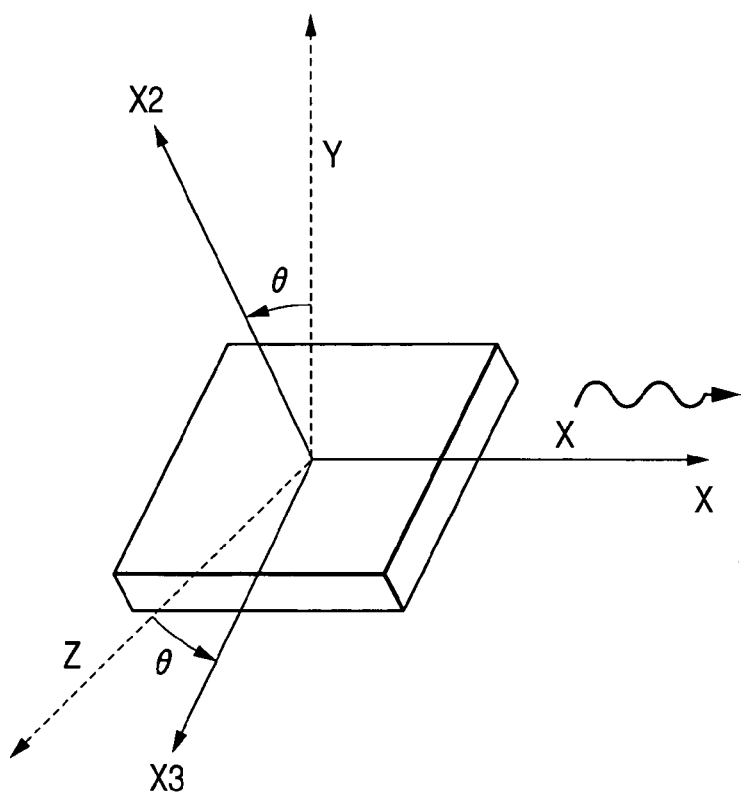
FIG. 2 is a schematic view illustrating a cut angle of a monocrystal piezoelectric substrate.

FIG. 2 shows a LiTaO$_3$ monocrystal having crystal axes X, Y, and Z cut in the state which the Y-axis tilts toward the Z-axis by the rotational angle θ around the crystal axis X. Such a piezoelectric substrate is referred to as a θ-rotated Y-cut LiTaO$_3$ substrate. The angle θ is referred to as a rotational cut angle or cut angle.

Figure 3:
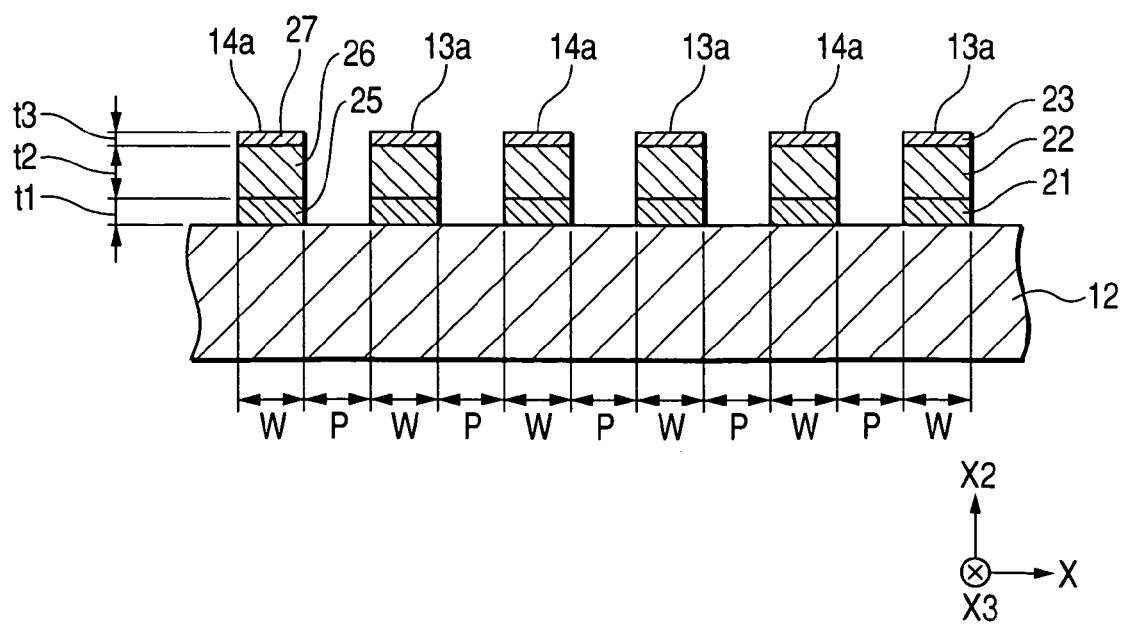
FIG. 3 is a cross-sectional view of the surface acoustic wave device taken along the line 3—3 of FIG. 1.

FIG. 3 is a longitudinal cross-sectional view of the interdigital electrode section 13 and the interdigital electrode section 14 taken along the line 3-3 of FIG. 1 as viewed in a direction by arrows.

In the present embodiment, the interdigital electrode section 13 has a laminate structure of a base layer 21, a main electrode layer 22 deposited to come in contact with an upper surface of the base layer 21, and a protective layer 23 deposited on the main electrode layer 22. Similarly, the interdigital electrode section 14 has a laminated structure of a base layer 25, a main electrode layer 26 deposited to come in contact with the base layer 25, and a protective layer 27 deposited on the main electrode layer 26. The protective layer 23 and the protective layer 27 are formed with TiN (titanium nitride) or TiO$_x$N$_y$ (where 0<x<0.2, x+y=1). The base layers 21 and 25 are formed with, for example, one or more selected from the group consisting of TiN (titanium nitride), TiO$_x$N$_y$ (where 0<x<0.2, x+y=1), nickel (Ni), iron (Fe), magnesium (Mg), cobalt (Co), and osmium (Os). A pitch of the nearest neighbor atoms of crystals of such a material is in a range of from 2.40 Å to 3.30 Å.

TiN (titanium nitride), TiO$_x$N$_y$ (where 0<x<0.2, x+y=1), Ni, or Fe has a rock-salt crystal structure or a face-centered cubic crystal structure, and Mg, Co, or Os has a hexagonal closest-packed crystal structure. Among such materials, in particular, TiN or TiO$_x$N$_y$ is preferably used.

As a material for the main electrode layers 22 and 26, one or more selected from the group consisting of copper (Cu), aluminum (Al), platinum (Pt), gold (Au), and silver (Ag) are used. Alternatively, as the material for the main electrode layers 22 and 26, an alloy of one or more selected from the group consisting of Cu, Al, Pt, Au, and Ag and one or more selected from the group consisting of Ag, tin (Sn), carbon (C), scandium (Sc), and Cu may be used. More specifically, an AlScCu alloy, a CuAg alloy, or a CuScAg alloy may be used. A pitch of the nearest neighbor atoms of crystals of such a material is in range of from 2.50 Å to 3.00 Å. Cu, Al, Pt, Au, Ag, and the above-mentioned alloys all have a face-centered cubic crystal structure.

When the base layers 21 and 25 and the main electrode layers 22 and 26 are formed with the above-mentioned materials, a mismatch ratio between the pitch of the nearest neighbor atoms of the crystals of the base layers 21 and 25 and the pitch of the nearest neighbor atoms of the crystals of the main electrode layers 22 and 26 is preferably in a range of from −20% to 20%. More preferably, the mismatch ratio is in a range of from −15% to 15%.

Moreover, it is defined that the mismatch ratio=(pitch of the nearest neighbor atoms of the crystals of the base layer−pitch of the nearest neighbor atoms of the crystals of the main electrode layer)×100/(pitch of the nearest neighbor atoms of the crystals of the main electrode layer).

If the base layer is formed with TiN, oxygen of $LiTaO_3$ of the piezoelectric substrate combines with unnitrogenized Ti and oxygen is removed from the $LiTaO_3$. On the other hand, when the base layer is formed with $TiO_xN_y$, Ti is stabilized, and thus oxygen is not removed from $LiTaO_3$. Here, if the oxygen content of the $TiO_xN_y$ becomes high, electrical conductivity is lowered. Thus, the optimal oxygen content satisfying the 0<x<0.2 and x+y=1 must be selected.

In the embodiment shown in FIGS. 1 and 3, the interdigital electrode section 13 and the interdigital electrode section 14 have the same width W. The pitch P of the electrode fingers is constant. The width W of each of the interdigital electrode section 13 and the interdigital electrode section 14 is in a range of from 0.3 μm to 0.7 μm. The pitch P of the electrode fingers is in a range of from 0.3 μm to 0.7 μm.

Further, the film thickness t1 of each of the base layers 21 and 25 is in a range of from 5 nm to 20 nm. The film thickness t2 of each of the main electrode layers 22 and 26 is in a range of from 80 nm to 180 nm. The film thickness t3 of each of the protective layers 23 and 27 is in a range of from 5 nm to 20 nm. When the film thickness t1 of each of the base layers 21 and 25 is equal to or more than 5 nm, a {111} plane of each of the base layers 21 and 25 and the main electrode layers 22 and 26 has a constant gradient with respect to the substrate surface clearly.

Figure 4:
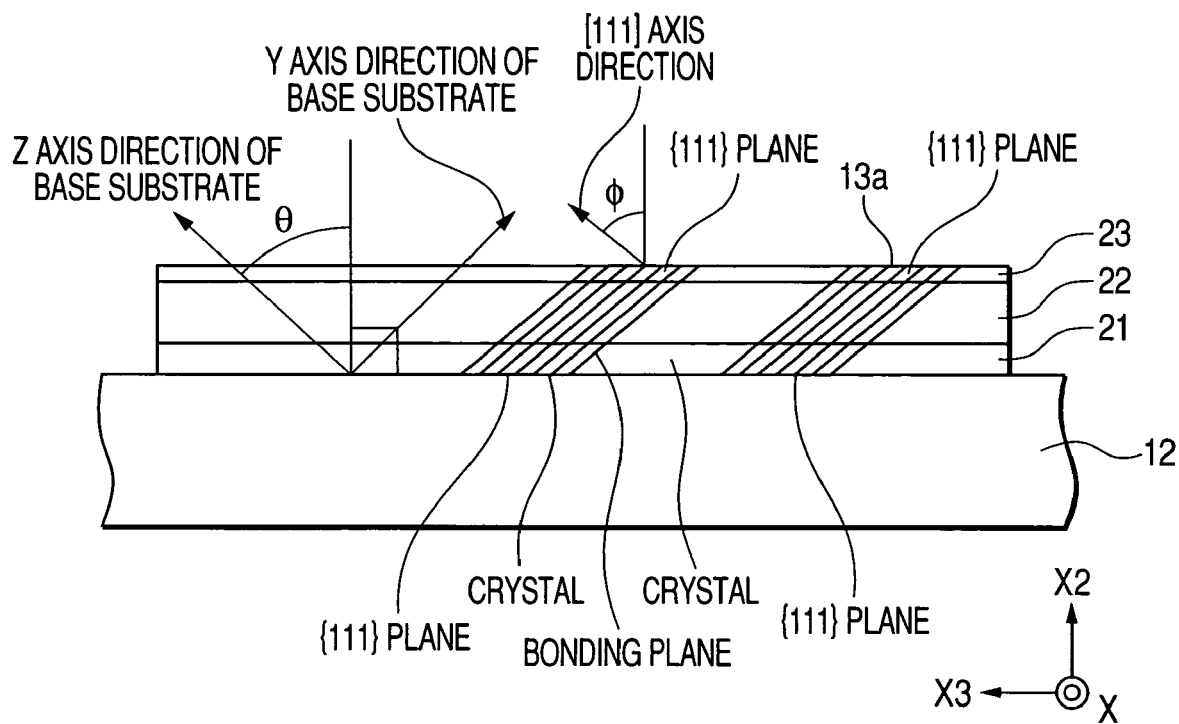
FIG. 4 is a side view of an interdigital electrode section of the surface acoustic wave device according to the present invention.

FIG. 4 is a side view of the electrode finger 13a of the interdigital electrode section 13. As shown in FIG. 4, the crystal of the main electrode layer 22 has a face-centered cubic structure and the {111} plane thereof has a constant gradient of an acute angle with respect to the substrate surface. The constant gradient is, for example, 51° and is equal to a value of an angle φ from a substrate normal direction in a [111] direction of the main electrode layer 22. The interdigital electrode section 14 also has the same structure.

In such a manner, if the main electrode layer is deposited such that the {111} plane as the closest-packed plane has the constant gradient with respect to the substrate surface, the electromigration or stress migration of the interdigital electrode sections 13 and 14 can be suppressed. As a result, a breakage of electrodes and electrical breaks can be prevented, an insertion loss of elements can be decreased, and a Q-factor of resonators can be increased. Therefore, properties of the surface acoustic wave device can be enhanced.

Further, as shown in FIG. 4, if the {111} plane of each of the main electrode layers 22 and 26 is parallel to an X-axis of crystals of the piezoelectric substrate, the {111} plane as the closest-packed plane crosses an amplitude direction of shear horizontal (SH) waves. Thus, resistance to electromigration or stress migration can be enhanced.

Further, the closest-packed plane of the base layer 21 (the {111} plane in the face-centered cubic crystal) has a constant gradient with respect to the substrate surface. In FIG. 4, the gradient of the {111} plane of the base layer 21 and the gradient of the {111} plane of the main electrode layer 22 are equal to each other, both of which are the face-centered cubic crystal. The crystals of the main electrode layer 22 are epitaxially or heteroepitaxially grown on the crystals of the base layer 21. At this time, a spot position of the {111} plane in a XRD (X-ray diffraction) pole figure of the crystals of the main electrode layer 22 and a spot position of the {111} plane in a XRD pole figure of the crystals of the base layer are aligned with each other. The same is applied to the interdigital electrode section 14.

Moreover, if the piezoelectric substrate 12 is made of $LiTaO_3$ having a Y-cut angle ranging from 36° to 60°, resonance property of the surface acoustic wave device can be enhanced.

Further, since the protective layers 23 and 27 made of TiN (titanium nitride) or $TiO_xN_y$ (where 0<x<0.2, x+y=1) are deposited on the main electrode layers 22 and 26 (or Al layers), the crystal structure of each of the main electrode layers 22 and 26 is stabilized, and thus resistance to electromigration or stress migration can be enhanced. Alternatively, the protective layers 23 and 27 may be not formed.

The interdigital electrode sections 13 and 14 of the surface acoustic wave device according to the present embodiment are preferably formed by means of a sputter method or a deposition method.

To begin with, a surface of the piezoelectric substrate 12 is pre-processed by means of ion etching or the like, and a crystal plane to be epitaxially grown in the surface of the piezoelectric substrate 12 is exposed. On the crystal plane of the piezoelectric substrate 12, the base layers 21 and 25 and the main electrode layers 22 and 26 are film-formed by means of the sputter method or the deposition method, such that the base layers 21 and 25 and the main electrode layers 22 and 26 may be formed as a layer having crystals which are predominantly oriented in the {111} direction. Further, the base layers 21 and 25 and the main electrode layers 22 and 26 may be formed such that the {111} plane has the constant gradient with respect to the substrate surface. By using the sputter method or the deposition method, the crystals of the main electrode layers 22 and 26 are easily epitaxially or heteroepitaxially grown on the crystals of the base layers 21 and 25 respectively.

In order to epitaxially or heteroepitaxially deposit the main electrode layers 22 and 26 on the base layers 21 and 25 respectively, when atoms of the material of the main electrode layers 22 and 26 which are struck from a target substrate reach the base layer 21 and 25 respectively, it is necessary to supply enouph energy such that the atoms of the main electrode layers 22 and 26 moderately move on the base layers 21 and 25 respectively. As a result, the atoms of the main electrode layers 22 and 26 can be rearranged according to the atomic arrangement of the base layers 21 and 25 respectively.

In order to increase the energy of the atoms of the main electrode layers 22 and 26, it is important to adjust a pressure of a sputter gas for striking the target. If the pressure of the sputter gas becomes excessively large, collision frequency of the atoms of the material of the main electrode layers 22 and 26 and sputter gas molecules increases, energy is lost until the atoms of the material of the main electrode layers 22 and 26 reach the base layers 21 and 25. For this reason, the pressure of the sputter gas is preferably low. Here, if the pressure is too low, a stable discharge can not be maintained.

Therefore, the pressure of the sputter gas for striking the target is preferably in a range of from $5 \times 10^{-4}$ Torr ($6.7 \times 10^{-2}$ Pa) to $3 \times 10^{-2}$ Torr (4 Pa). In the present embodiment, argon (Ar) is used as the sputter gas and the pressure of the sputter gas is $1.5 \times 10^{-3}$ Torr (0.2 Pa).

Further, if the temperature of the substrate on which the base layers 21 and 25 are formed becomes high, the atoms of the material of the main electrode layers 22 and 26, which reach the base layers 21 and 25 from the target, can easily move on the base layers 21 and 25 and can rearranged according to the atomic arrangement of the base layers 21 and 25. However, if the temperature of the substrate on which the base layers 21 and 25 becomes excessively large, interdiffusion of the atoms in interfaces of the base layers 21 and 25 and the main electrode layers 22 and 26 is increased drastically which may be detrimental in that sharp interfaces may not be obtained.

Therefore, the temperature of the substrate on which the base layers 21 and 25 is preferably in a range of from 0° C. to 100° C.

In order to increase the energy when the atoms of the material of the main electrode layers 22 and 26 reach the base layers 21 and 25, the distance between the target and the substrate on which the base layers 21 and 25 are formed is set to be short, such that the collision frequency of the atoms of the material of the main electrode layers 22 and 26 and the sputter gas molecules may be decreased. However, if the distance between the target and the substrate on which the base layers 21 and 25 are formed is excessively short, the temperature of the substrate on which the base layers 21 and 25 are formed becomes excessively high due to secondary electrons from the target or heat of radiation. Accordingly, the interdiffusion of the atoms in the interfaces of the base layers 21 and 25 and the main electrode layers 22 and 26 is increased drastically. Further, if the distance between the target and the substrate on which the base layers 21 and 25 becomes short, it is difficult to film-form the main electrode layers 22 and 26 having a uniform film thickness.

Therefore, the distance between the target and the substrate on which the base layers 21 and 25 are formed is preferably in a range of from 50 mm to 300 mm. In the present embodiment, the distance between the target and the substrate on which the base layers 21 and 25 are formed is set to 89 mm.

EXAMPLE 1

Figure 5:
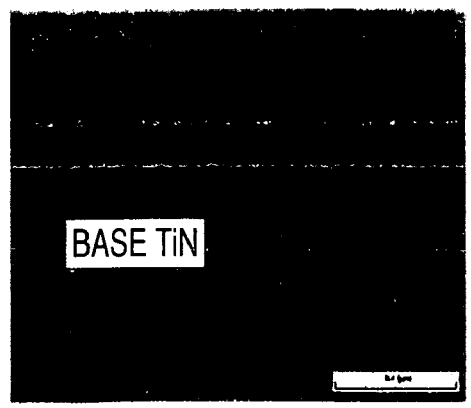
FIG. 5 is a photograph showing an expanded partial side surface of the interdigital electrode section of the surface acoustic wave device according to the present invention.
Figure 6:
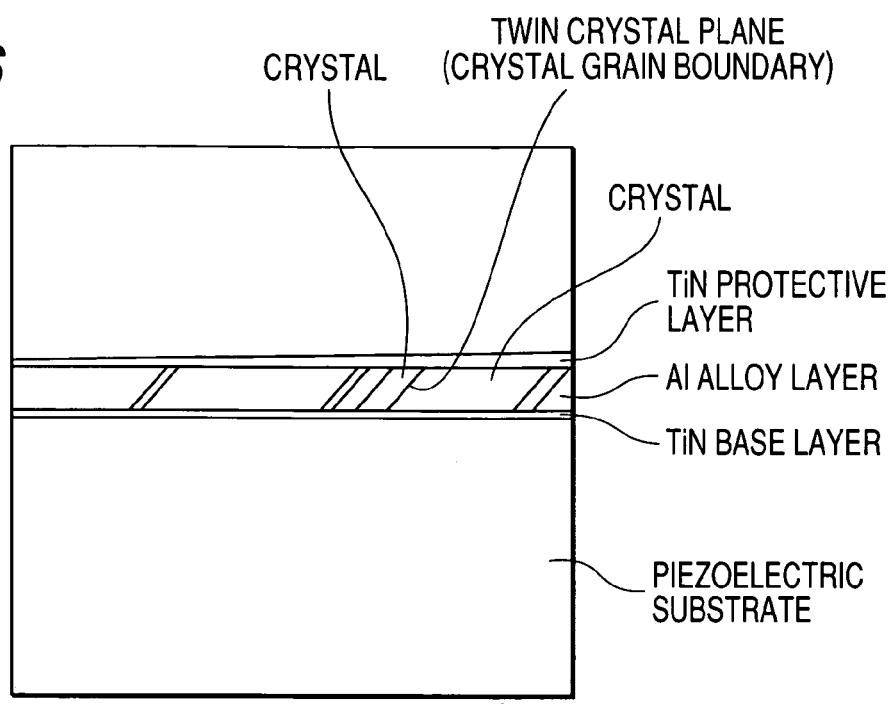
FIG. 6 is an expanded partial side view schematically showing the interdigital electrode section in FIG. 5.
Figure 7:
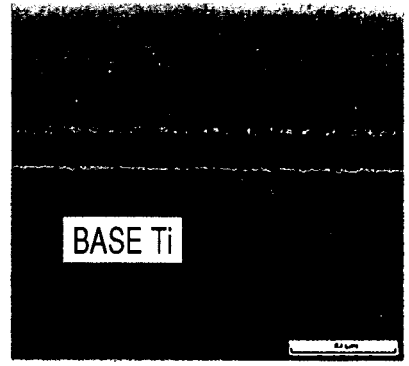
FIG. 7 is a photograph showing an expanded partial side surface of an interdigital electrode section of a surface acoustic wave device according to a comparative example.
Figure 8:
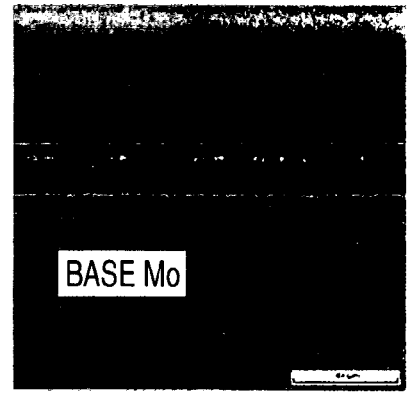
FIG. 8 is a photograph showing an expanded partial side surface of an interdigital electrode section of another surface acoustic wave device according to a comparative example.
Figure 9:
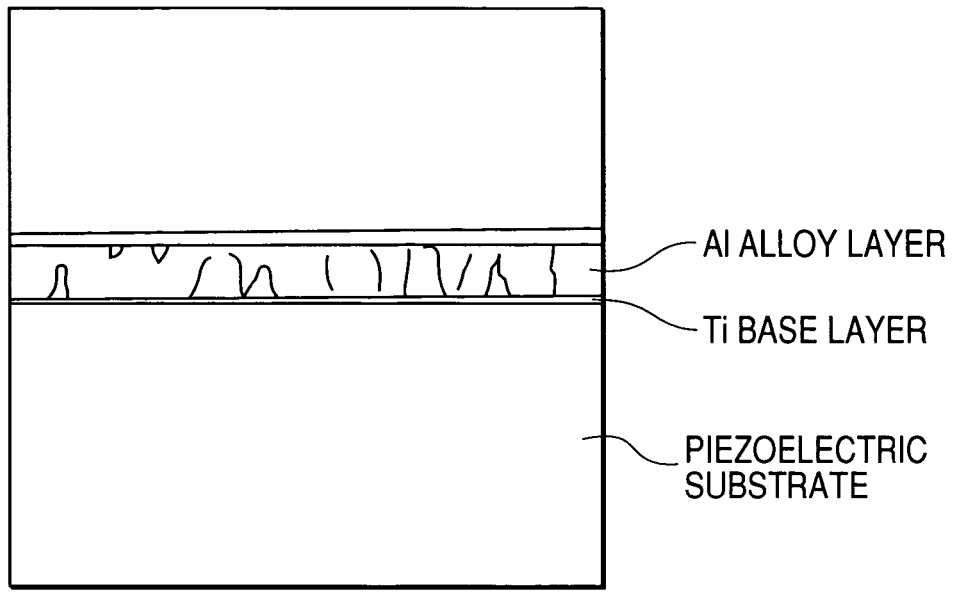
FIG. 9 is an expanded partial side view schematically showing the interdigital electrode section in FIG. 7.
Figure 10:
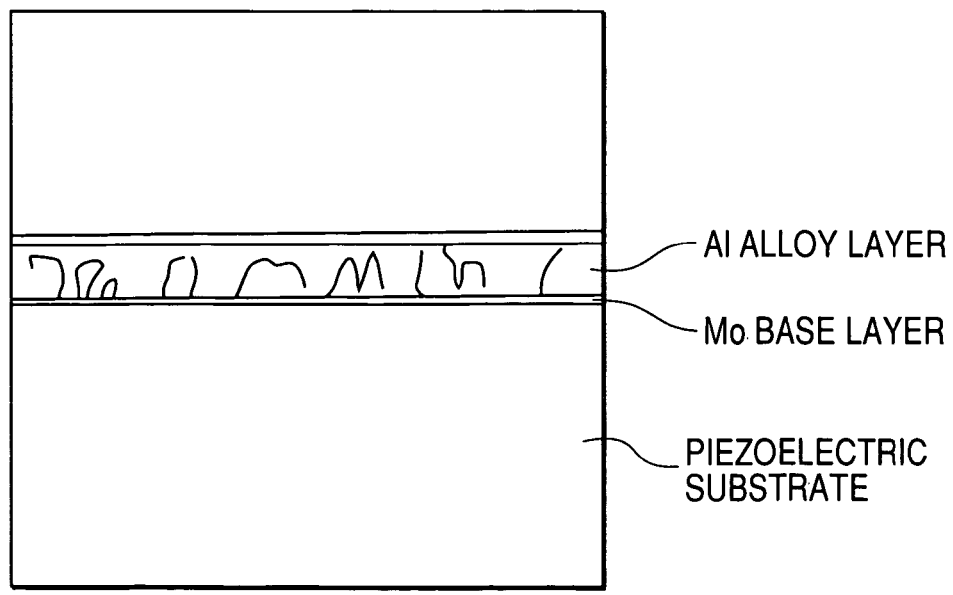
FIG. 10 is an expanded partial side view schematically showing the interdigital electrode section in FIG. 8.

The Al alloy layer (the main electrode layer) made of an AlScCu alloy is film-formed on the piezoelectric substrate made of LiTaO$_3$ having the Y-cut angle of 46° through the base layer by means of the sputter method. FIG. 5 is an expanded photograph of the interdigital electrode section of the surface acoustic wave device according to an example 1 in which the base layer is formed with TiN, as viewed from a cross-section orthogonal to the X-axis of the LiTaO$_3$ substrate. FIG. 6 is a partial side view schematically showing the interdigital electrode section shown in FIG. 5. FIG. 7 is an expanded photograph showing an interdigital electrode section of a surface acoustic wave device according to a comparative example 1 in which the base layer is formed with Ti, and FIG. 8 is an expanded photograph showing an interdigital electrode section of a surface acoustic wave device according to a comparative example 2 in which the base layer is formed with Mo. FIGS. 9 and 10 are partial side views schematically showing the interdigital electrode sections shown in FIGS. 7 and 8 respectively.

As shown in FIGS. 5 and 6, the crystal of the Al alloy layer has the face-centered cubic structure and the {111} plane thereof has the constant gradient of an acute angle with respect to the substrate surface. The constant gradient is 51° and is equal to a value of an angle φ from the surface normal direction in the [111] direction of the Al alloy layer. Moreover, the {111} plane of the Al alloy layer is parallel to the X-axis of the crystal of the piezoelectric substrate, and the {111} plane as the closest-packed plane crosses the amplitude direction of the SH waves.

Further, the inclination angle of the {111} plane of the base layer and the inclination angle of the {111} plane of the Al alloy layer are equal to each other. Moreover, the base layer formed with TiN (titanium nitride) or TiO$_x$N$_y$ (where $0<x<0.2$, $x+Y=1$) has the rock-salt structure or the face-centered cubic structure. The crystals of the Al alloy layer are epitaxially or heteroepitaxially grown on the crystals of the base layer. At this time, the spot position of the {111} plane in the XRD pole figure of the crystals of the Al alloy layer and the spot position of the {111} plane in the XRD pole figure of the crystals of the base layer are aligned with each other.

Further, the Al alloy layer has a twin crystal structure of which a crystal grain boundary is linear. Accordingly, withstand power of the surface acoustic wave device can be enhanced.

On the other hand, the orientation of the {111} direction of each of the base layer and the Al alloy layer of the interdigital electrode section of the surface acoustic wave device according to the comparative examples 1 and 2 is weak as compared to the example 1. A table 1 shows peak intensity of the {111} plane according to X-ray diffraction of the Al alloy layer in each of the example 1, the comparative example 1, and the comparative example 2.

TABLE 1

The Al (111) peak intensity axially arranged by the XRD pole figure

| | [Unit: cps] |
|---|---|
| Base TiN 5 nm | 45068 |
| Base Ti 5 nm | 8357 |
| Base Mo 5 nm | 597 |

AlScCu Film Thickness 150 nm/Protective layer Mo 5 nm

The {111} plane of each of the base layer and the Al alloy layer in each of the comparative examples 1 and 2 is parallel to the substrate surface. Further, the crystal grain boundary of the Al alloy layer in each of the comparative examples 1 and 2 is linear, unlike the example 1.

Figure 11:
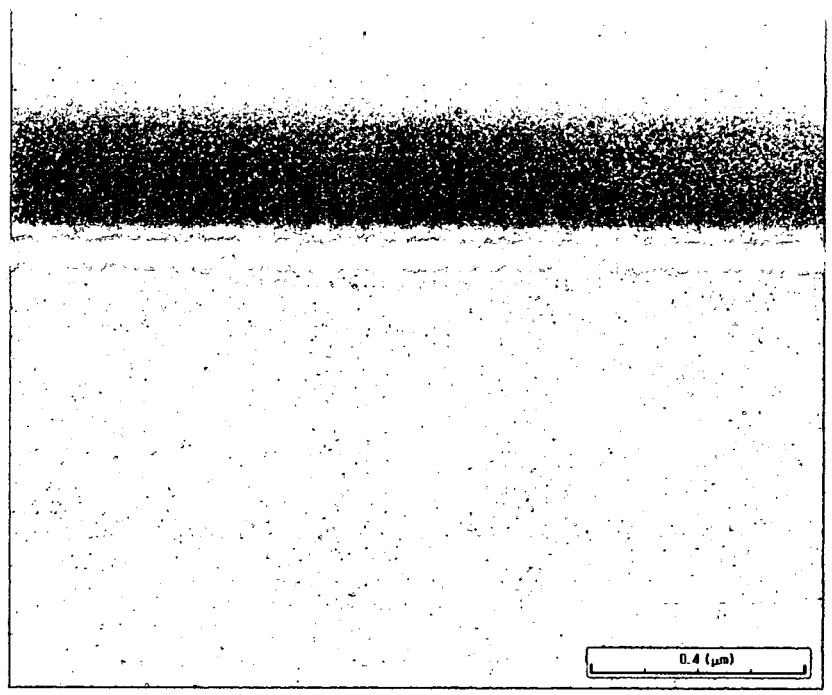
FIG. 11 is a photograph showing an expanded partial side surface of an interdigital electrode section of another surface acoustic wave device according to the present invention.
Figure 12:
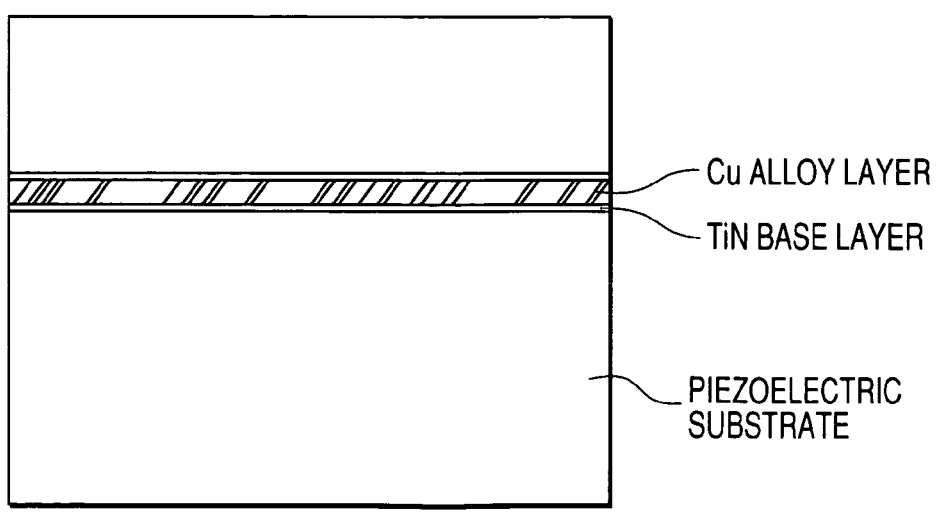
FIG. 12 is an expanded partial side view schematically showing the interdigital electrode section in FIG. 11.
Figure 13:
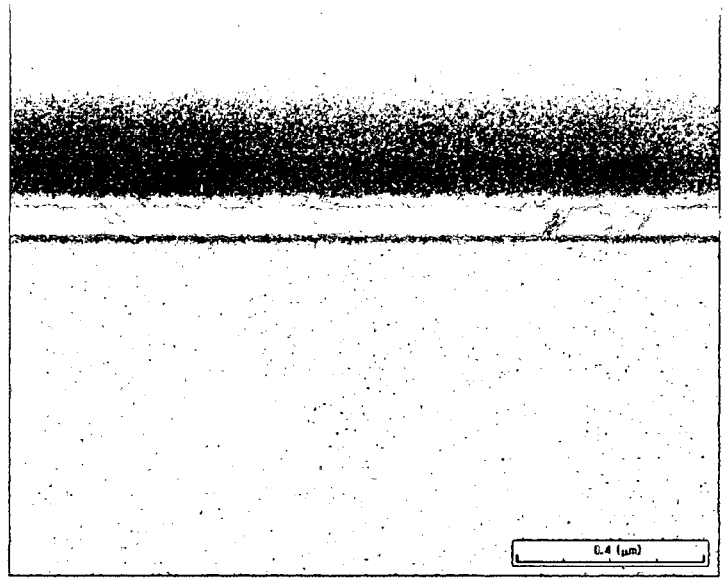
FIG. 13 is a photograph showing an expanded partial side surface of an interdigital electrode section of another surface acoustic wave device according to a comparative example.
Figure 14:
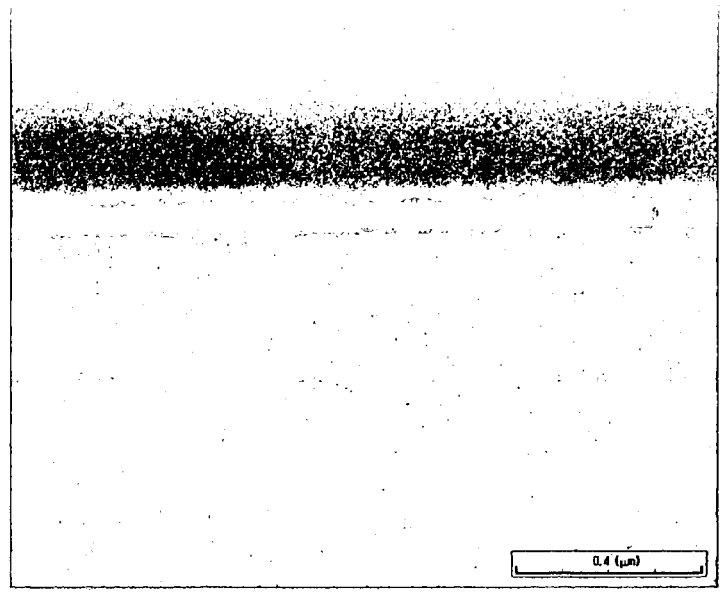
FIG. 14 is a photograph showing an expanded partial side surface of an interdigital electrode section of another surface acoustic wave device according to a comparative example.
Figure 15:
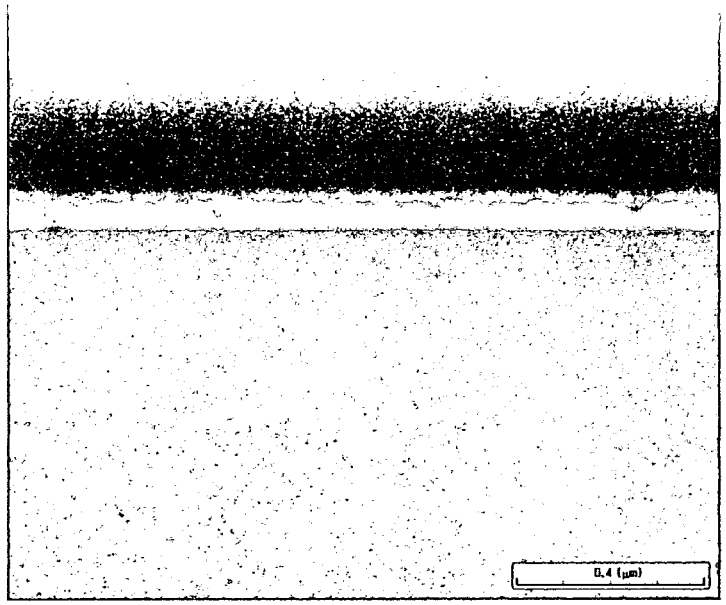
FIG. 15 is a photograph showing an expanded partial side surface of an interdigital electrode section of another surface acoustic wave device according to a comparative example.
Figure 16:
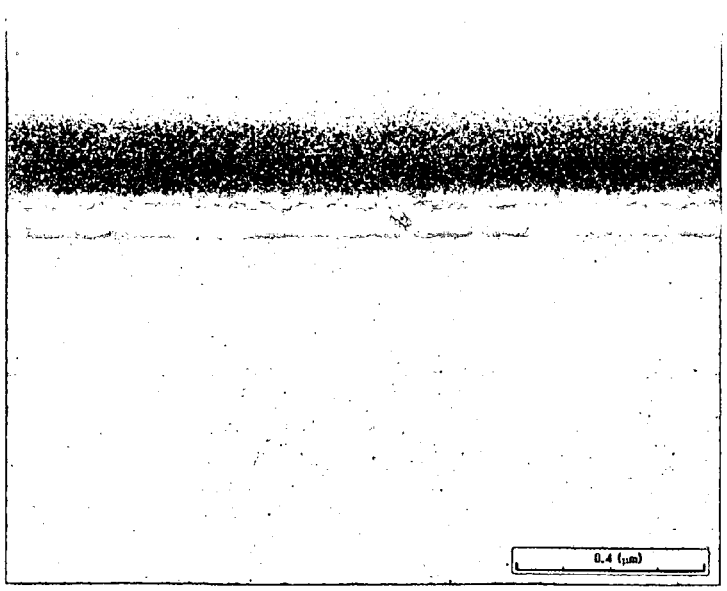
FIG. 16 is a photograph showing an expanded partial side surface of an interdigital electrode section of another surface acoustic wave device according to a comparative example.
Figure 17:
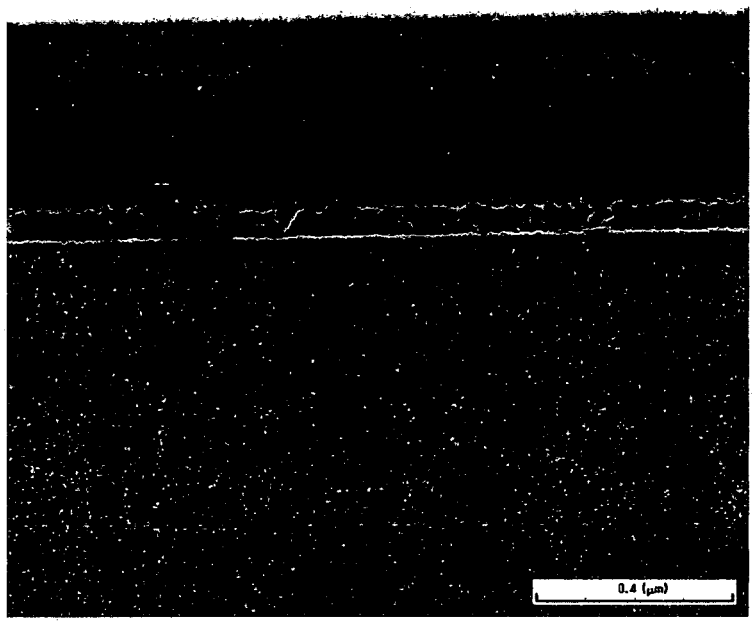
FIG. 17 is a photograph showing an expanded partial side surface of an interdigital electrode section of another surface acoustic wave device according to a comparative example.
Figure 18:
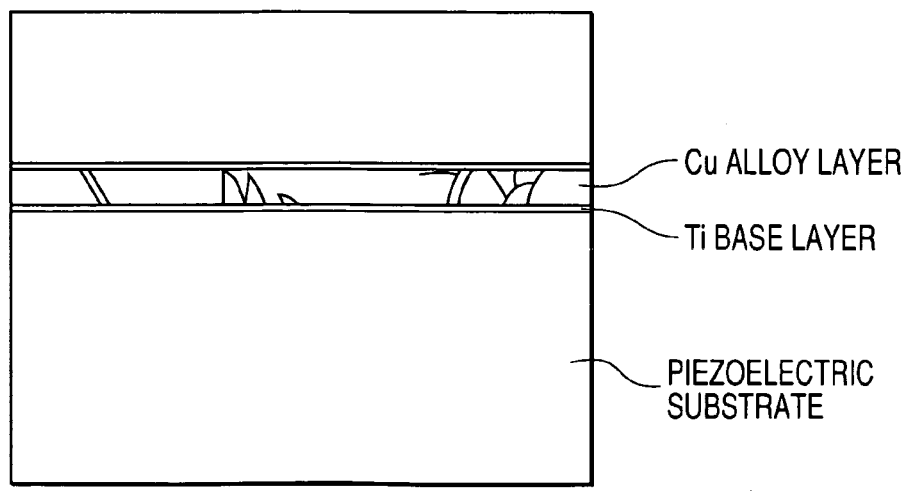
FIG. 18 is an expanded partial side view schematically showing the interdigital electrode section in FIG. 13.
Figure 19:
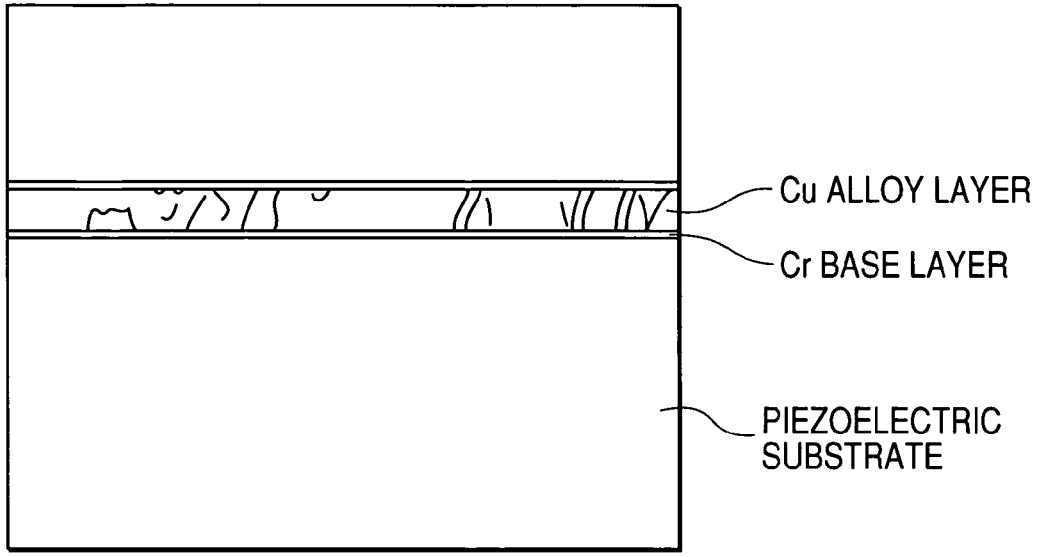
FIG. 19 is an expanded partial side view schematically showing the interdigital electrode section in FIG. 14.
Figure 20:
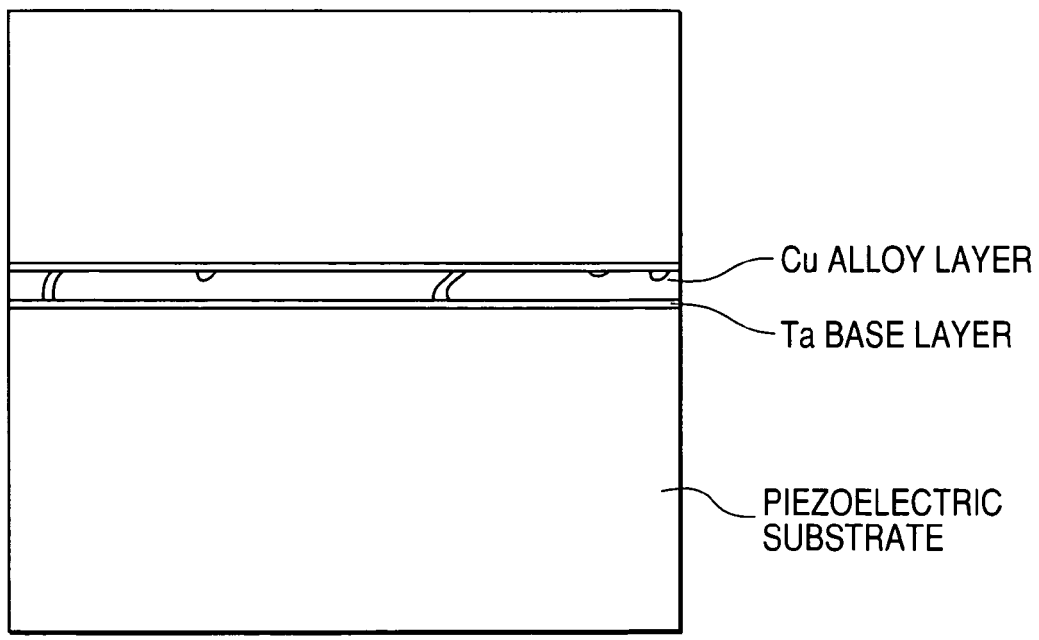
FIG. 20 is an expanded partial side view schematically showing the interdigital electrode section in FIG. 15.
Figure 21:
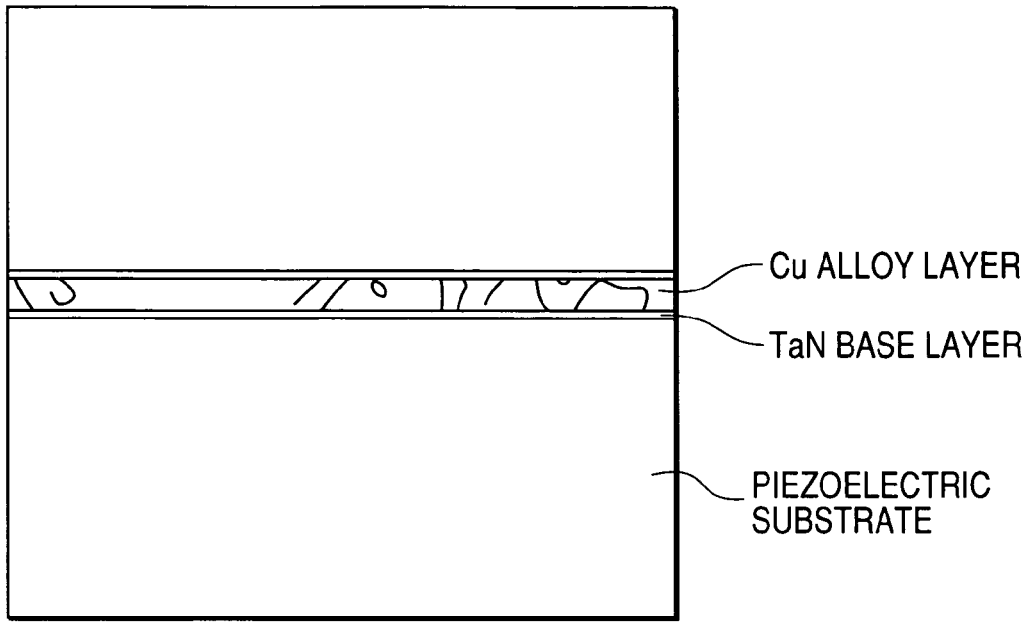
FIG. 21 is an expanded partial side view schematically showing the interdigital electrode section in FIG. 16.
Figure 22:
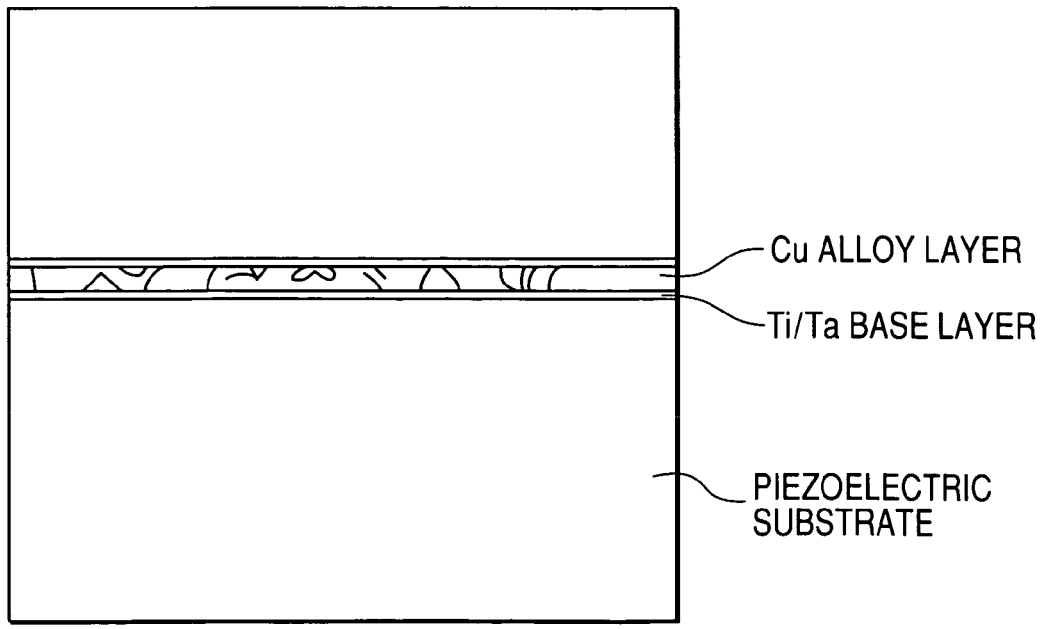
FIG. 22 is an expanded partial side view schematically showing the interdigital electrode section in FIG. 17.
Figure 23:
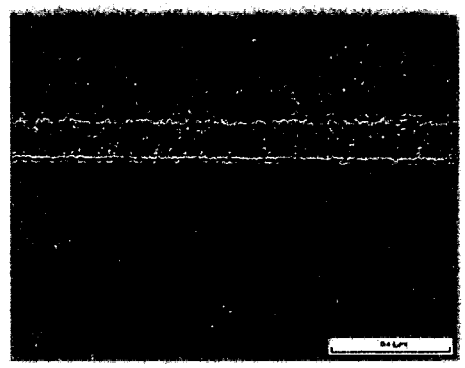
FIG. 23 is a photograph showing an expanded partial side surface of an interdigital electrode section of another surface acoustic wave device according to the present invention.
Figure 24:
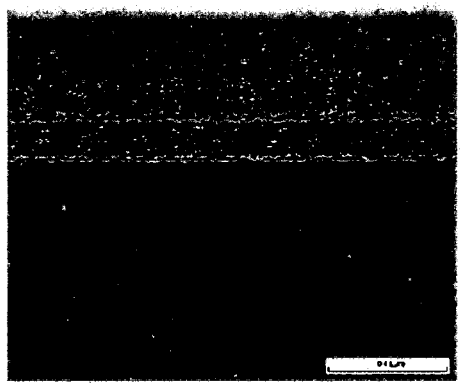
FIG. 24 is a photograph showing an expanded partial side surface of an interdigital electrode section of another surface acoustic wave device according to the present invention.
Figure 25:
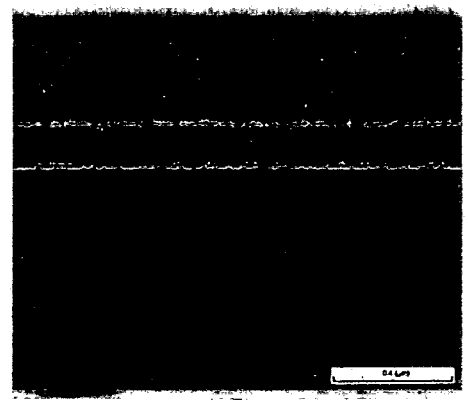
FIG. 25 is a photograph showing an expanded partial side surface of an interdigital electrode section of another surface acoustic wave device according to the present invention.
Figure 26:
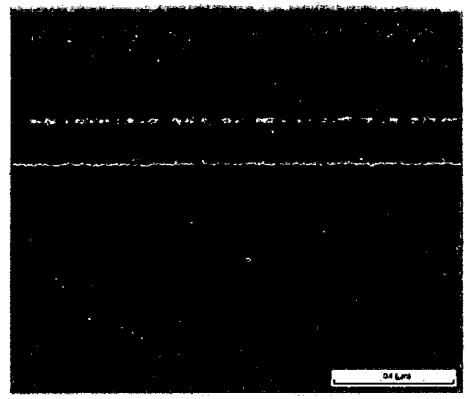
FIG. 26 is a photograph showing an expanded partial side surface of an interdigital electrode section of another surface acoustic wave device according to the present invention.
Figure 27:
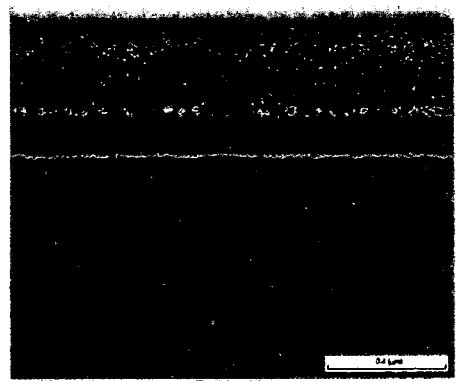
FIG. 27 is a photograph showing an expanded partial side surface of an interdigital electrode section of another surface acoustic wave device according to the present invention.
Figure 28:
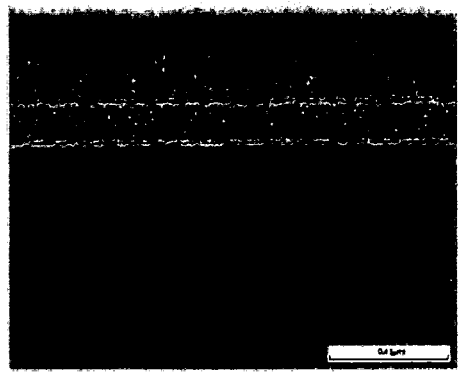
FIG. 28 is a photograph showing an expanded partial side surface of an interdigital electrode section of another surface acoustic wave device according to the present invention.

Next, the main electrode layer made of a CuAg alloy is film-formed on the piezoelectric substrate made of LiTaO$_3$ having the Y-cut angle of 48° through the base layer by means of a sputter method. FIG. 11 is an expanded photograph showing the interdigital electrode section of the surface acoustic wave device according to another example in which the base layer is formed with TiN, as viewed from a cross-section orthogonal to the X-axis of the LiTaO$_3$ substrate. FIG. 12 is a partial side view schematically showing the interdigital electrode section shown in FIG. 11. FIG. 13 is an expanded photograph showing an interdigital electrode section of a surface acoustic wave device according to a comparative example 3 in which a main electrode layer is made of a CuAg alloy and a base layer is formed with Ti. FIG. 14 is an expanded photograph showing an interdigital electrode section of a surface acoustic wave device according to a comparative example 4 in which a main electrode layer is made of a CuAg alloy and a base layer is formed with Cr. FIG. 15 is an expanded photograph showing an interdigital electrode section of a surface acoustic wave device according to a comparative example 5 in which a main electrode layer is made of a CuAg alloy and a base layer is formed with Ta. FIG. 16 is an expanded photograph showing an interdigital electrode section of a surface acoustic wave device according to a comparative example 6 in which a main electrode layer is made of a CuAg alloy and a base layer is formed with TaN. FIG. 17 is an expanded photograph showing an interdigital electrode section of a surface acoustic wave device according to a comparative example 7 in which a main electrode layer is made of a CuAg alloy and a base layer is formed with a Ti/Ta laminated film. FIGS. 18 to 22 are partial side views schematically showing the interdigital electrode sections shown in FIGS. 13 to 17.

As shown in FIGS. 11 and 12, the crystal of the main electrode layer in the example has the face-centered cubic structure and the {111} plane thereof has the constant gradient of the acute angle with respect to the substrate surface. The constant gradient is 48° and is equal to the value of the angle φ from the substrate normal direction in the [111] direction of the main electrode layer. Moreover, the {111} plane of the main electrode layer is parallel to the X-axis of the crystal of the piezoelectric substrate and the {111} plane as the closest-packed plane crosses the amplitude direction of the SH waves.

Further, the inclination angle of the {111} plane of the base layer and the inclination angle of the {111} plane of the main electrode layer are equal to each other. Moreover, the base layer formed with TiN (titanium nitride) or TiO$_x$N$_y$ (where 0<x<0.2, x+Y=1) has the rock-salt structure or the face-centered cubic structure. The crystals of the main electrode layer are epitaxially or heteroepitaxially grown on the crystals of the base layer. At this time, the spot position of the {111} plane in the XRD pole figure of the crystals of the main electrode layer and the spot position of the {111} plane in the XRD pole figure of the crystals of the base layer are aligned with each other.

Further, the main electrode layer has the twin crystal structure of which the crystal grain boundary is linear. Accordingly, withstand power of the surface acoustic wave device can be enhanced.

On the other hand, the orientation of the {111} direction of each of the base layer and the main electrode layer of the interdigital electrode section of the surface acoustic wave device according to the comparative examples 3 to 7 are weak as compared to the example. A table 2 shows peak intensity of the {111} plane according to X-ray diffraction in each of the example and the comparative examples 3 to 7.

TABLE 2

The Cu (111) peak intensity axially arranged by the XRD pole figure

[Unit: cps]

| | |
|---|---|
| Base TiN 10 nm | 43424 |
| Base Ti 10 nm | 5337 |
| Base Cr 10 nm | 802 |
| Base Ta 10 nm | 4334 |
| Base TaN 10 nm | 219 |

TABLE 2-continued

The Cu (111) peak intensity axially arranged by the XRD pole figure

[Unit: cps]

| | |
|---|---|
| Base Ti 5 nm/Ta 5 nm | 8098 |

Base Layer/CuAg Film Thickness 80 nm/Protective layer Cr 5 nm

The {111} plane of each of the base layer and the main electrode layer in each of the comparative examples 3 to 7 is parallel to the substrate surface. Further, the crystal grain boundary of the main electrode layer in each of the comparative examples 3 to 7 is not linear, unlike the example.

FIGS. 23 to 28 are expanded photographs respectively showing the interdigital electrode sections in which the Al alloy layer made of an AlScCu alloy is film-formed on the piezoelectric substrate made of LiTaO$_3$ having the Y-cut angles of 42°, 44°, 46°, 48°, 50°, and 52° through the base layer made of TiN by means of the sputter method, as viewed from a cross-section orthogonal to the X-axis of the LiTaO$_3$ substrate.

As shown in FIGS. 23 to 28, even though the Y-cut angle of the piezoelectric substrate varies in a range of from 42° to 52°, the crystal of the Al alloy layer has the face-centered cubic structure and the {111} plane thereof has the constant gradient of the acute angle with respect to the substrate surface. Besides, the crystal grain boundary is close to a monocrystal and is linear. Further, the Al alloy layer has the twin crystal structure having only two kinds of crystals which rotate around the [111] direction. Therefore, the growth of hillocks or voids due to diffusion of atoms which constitute the Al alloy and pass through the crystal grain boundary can be suppressed and thus electromigration and stress migration can be reduced.

FIGS. 29 to 39 are expanded photographs respectively showing the interdigital electrode sections in which the main electrode layer made of a CuAg alloy is film-formed on the piezoelectric substrate made of LiTaO$_3$ having the Y-cut angles of 36°, 42°, 44°, 46°, 48°, 50°, 52°, 54°, 56°, 58°, and 60° through the base layer made of TiN by means of the sputter method, as viewed from a cross-section orthogonal to the X-axis of the LiTaO$_3$ substrate.

As shown in FIGS. 29 to 39, even though the Y-cut angle of the piezoelectric substrate varies in a range of from 36° to 60°, the crystal of the main electrode layer has the face-centered cubic structure and the {111} plane thereof has the constant gradient of the acute angle with respect to the substrate surface. Besides, the crystal grain boundary does not exist and is close to a monocrystal, or the crystal grain boundary is linear. Further, the main electrode layer has the twin crystal structure having only two kinds of crystals which rotate around the [111] direction. Therefore, the growth of hillocks or voids due to diffusion of atoms which constitute the CuAg alloy and pass through the crystal grain boundary can be suppressed and thus electromigration and stress migration can be reduced.

Figure 29:
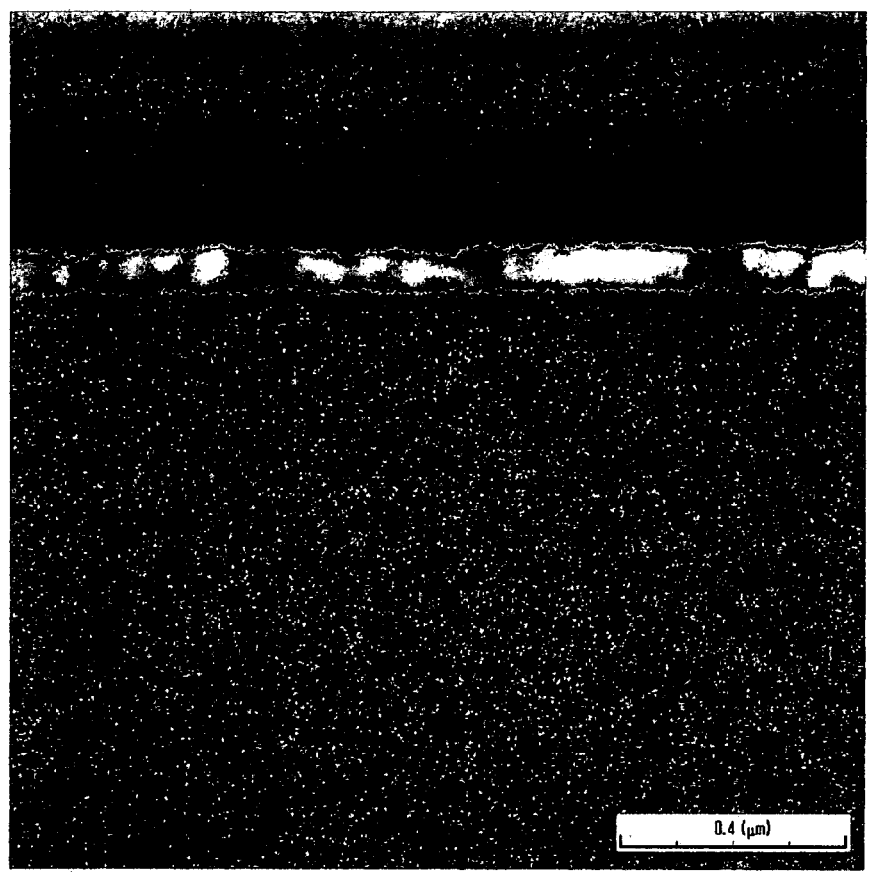
FIG. 29 is a photograph showing an expanded partial side surface of an interdigital electrode section of another surface acoustic wave device according to the present invention.
Figure 30:
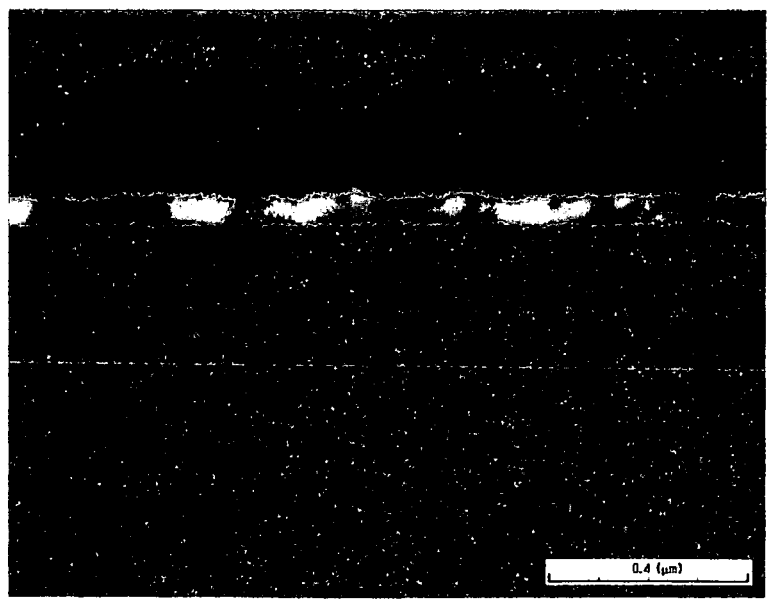
FIG. 30 is a photograph showing an expanded partial side surface of an interdigital electrode section of another surface acoustic wave device according to the present invention.
Figure 31:
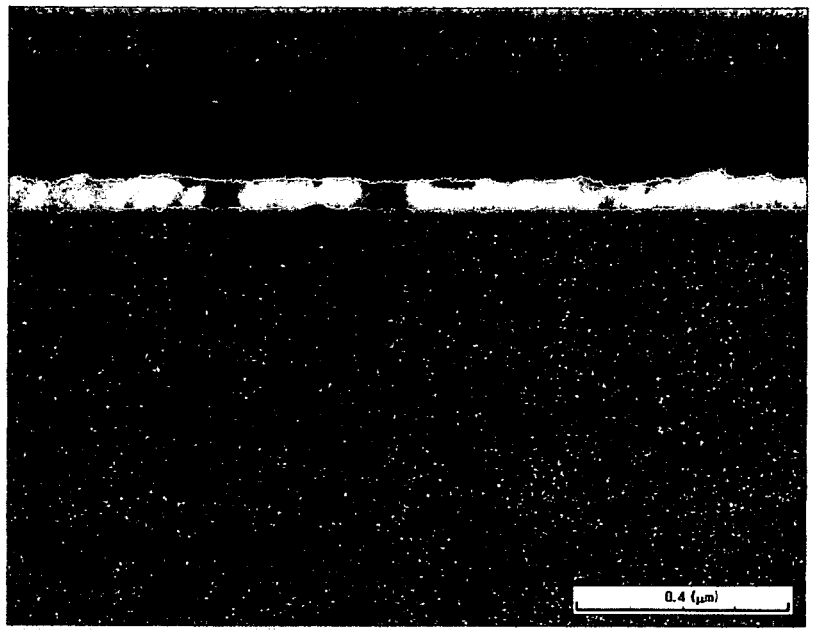
FIG. 31 is a photograph showing an expanded partial side surface of an interdigital electrode section of another surface acoustic wave device according to the present invention.
Figure 32:
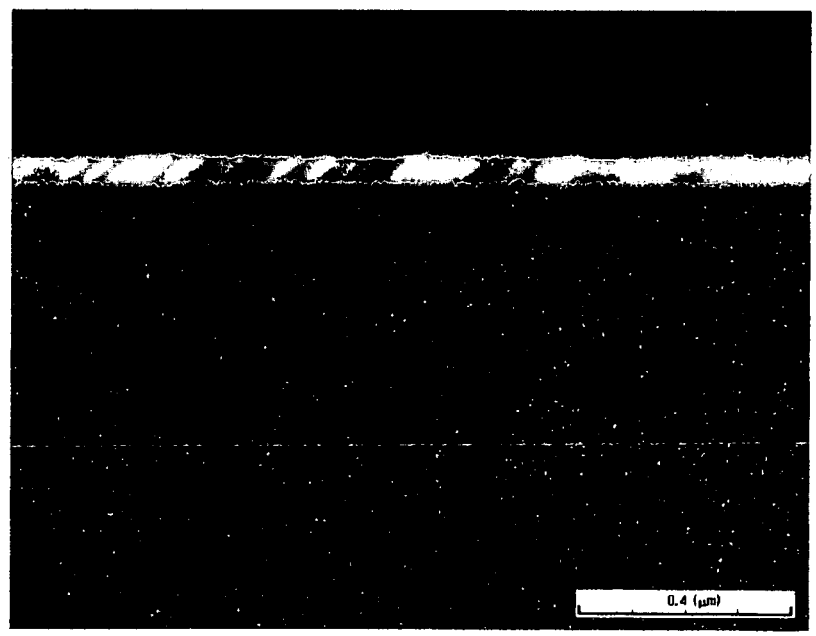
FIG. 32 is a photograph showing an expanded partial side surface of an interdigital electrode section of another surface acoustic wave device according to the present invention.
Figure 33:
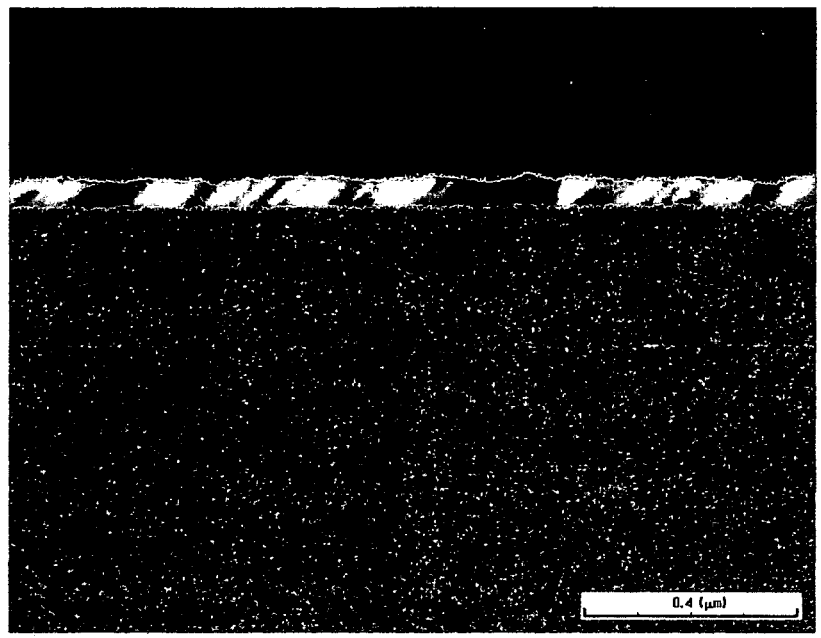
FIG. 33 is a photograph showing an expanded partial side surface of an interdigital electrode section of another surface acoustic wave device according to the present invention.
Figure 34:
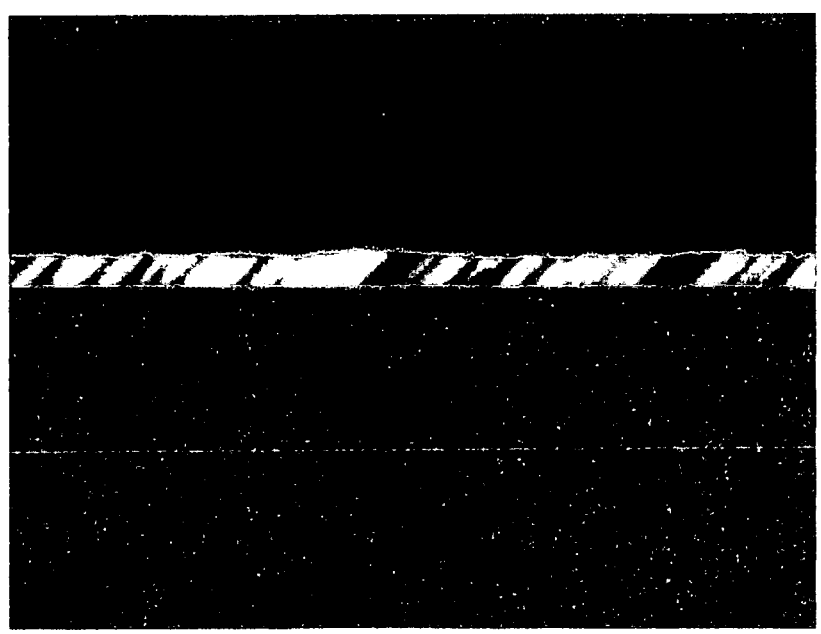
FIG. 34 is a photograph showing an expanded partial side surface of an interdigital electrode section of another surface acoustic wave device according to the present invention.
Figure 35:
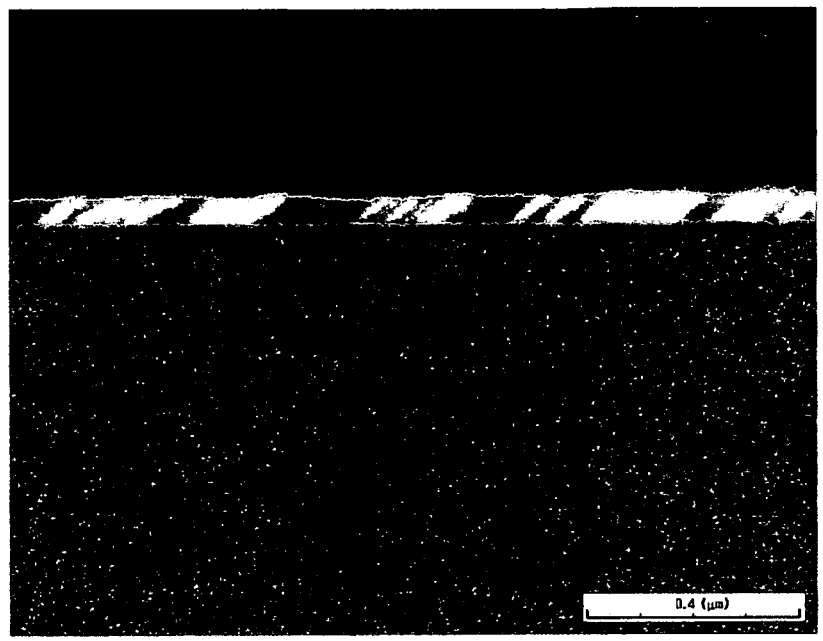
FIG. 35 is a photograph showing an expanded partial side surface of an interdigital electrode section of another surface acoustic wave device according to the present invention.
Figure 36:
FIG. 36 is a photograph showing an expanded partial side surface of an interdigital electrode section of another surface acoustic wave device according to the present invention.
Figure 37:
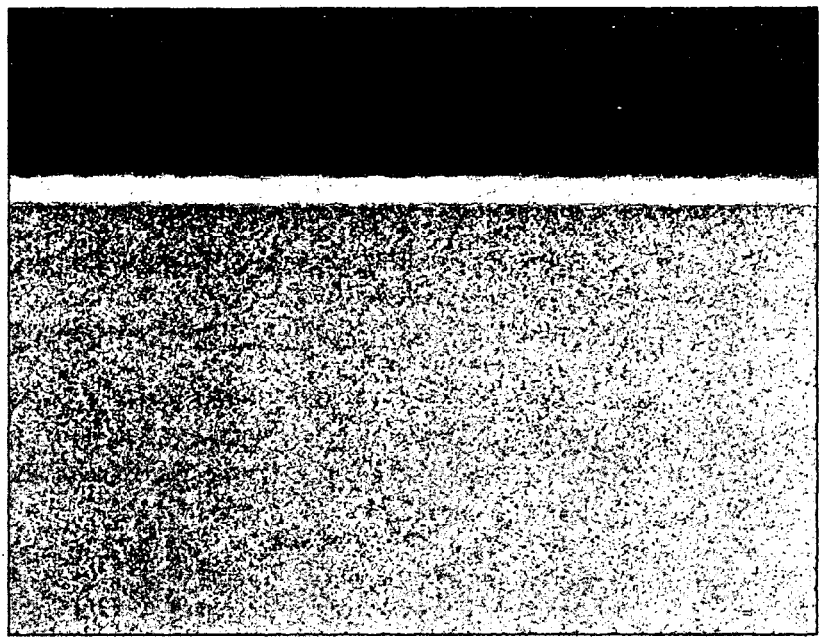
FIG. 37 is a photograph showing an expanded partial side surface of an interdigital electrode section of another surface acoustic wave device according to the present invention.
Figure 38:
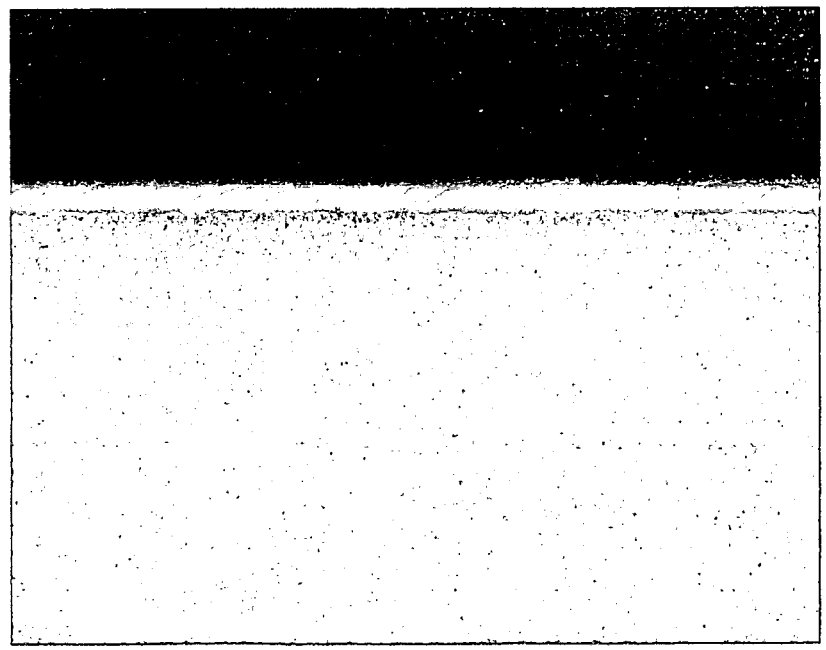
FIG. 38 is a photograph showing an expanded partial side surface of an interdigital electrode section of a surface acoustic wave device according to the present invention.
Figure 39:
FIG. 39 is a photograph showing an expanded partial side surface of an interdigital electrode section of another surface acoustic wave device according to the present invention.

Moreover, in FIGS. 29 to 31, a region where the crystal grain boundary is not clear is observed. However, by referring to an XRD pole figure described below, it can be seen that even when the Y-cut angles of the piezoelectric substrates are 36°, 42°, and 44°, the crystal of the main electrode layer has the face-centered cubic structure and the {111} plane thereof has the constant gradient of the acute angle with respect to the substrate surface.

Figure 40:
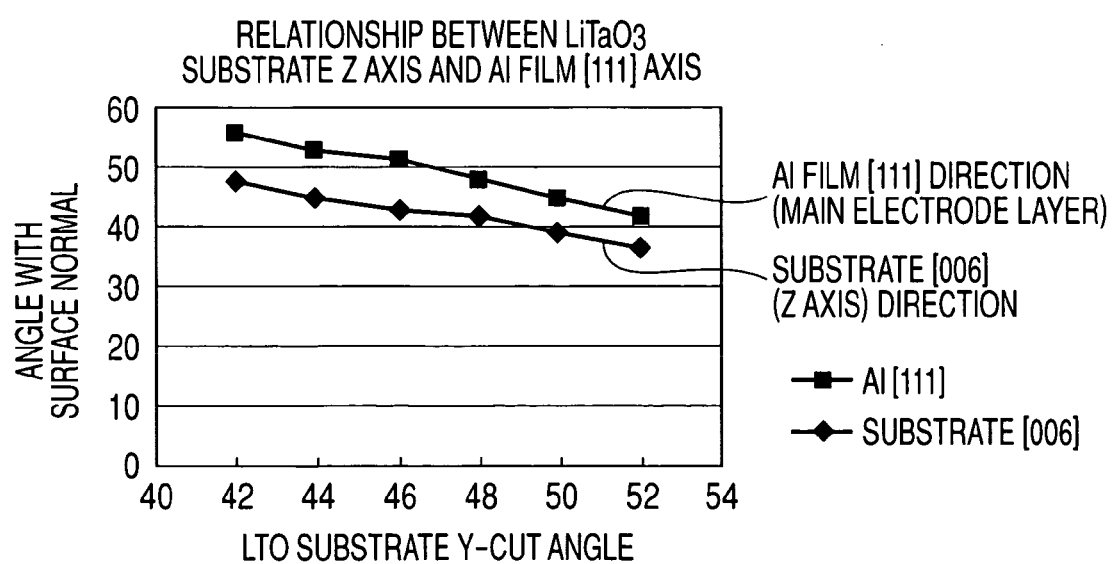
FIG. 40 is a graph showing a relationship between a Y-cut angle of a piezoelectric substrate and an angle to a substrate normal surface in a [111] axis direction of a main electrode layer (an Al alloy) of an interdigital electrode section.

FIG. 40 is a graph showing relationships between the Y-cut angle of LiTaO$_3$ which forms the piezoelectric substrate, and an angle in the Z-axis direction ([006] direction) of the LiTaO$_3$ crystal with respect to a substrate surface normal direction and an angle from the substrate surface normal direction in the [111] direction of the crystal of the main electrode layer, made of an AlScCu alloy, which is formed through the base layer made of TiN.

As shown in FIG. 40, as the Y-cut angle of LiTaO$_3$ increases, the angle in the Z-axis direction of the LiTaO$_3$ crystal with respect to the substrate surface normal direction and the angle from the substrate surface normal direction in the [111] direction of the crystal of the main electrode layer which is formed through the base layer made of TiN decrease.

When the Y-cut angle of LiTaO$_3$ is the same, the angle from the substrate surface normal direction in the [111] direction of the crystal of the main electrode layer which is formed through the base layer made of TiN is constantly larger than the angle in the Z-axis direction of the LiTaO$_3$ crystal with respect to the substrate surface normal direction by from 5° to 8°.

Moreover, when the substrate is made of LiTaO$_3$ having the Y-cut angle ranging from 42° to 48°, the angle from the substrate normal direction in the [111] direction of the crystal of the main electrode layer is larger than the cut angle of the piezoelectric substrate.

Figure 41:
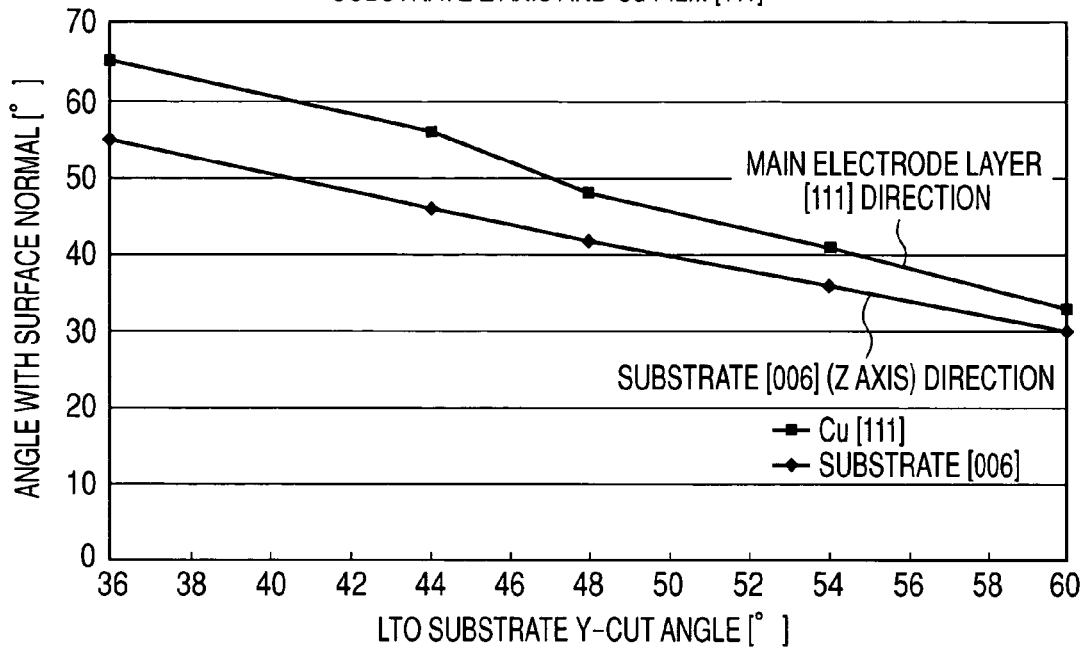
FIG. 41 is a graph showing a relationship between a Y-cut angle of a piezoelectric substrate and an angle to a substrate normal surface in a [111] axis direction of a main electrode layer (a Cu alloy) of an interdigital electrode section.

FIG. 41 is a graph showing relationships between the Y-cut angle of LiTaO$_3$ which forms the piezoelectric substrate, and an angle in the Z-axis direction ([006] direction) of the LiTaO$_3$ crystal with respect to a substrate surface normal direction and an angle from the substrate surface normal direction in the [111] direction of the crystal of the main electrode layer, made of a CuAg alloy, which is formed through the base layer made of TiN.

As shown in FIG. 41, as the Y-cut angle of LiTaO$_3$ increases, the angle in the Z-axis direction of the LiTaO$_3$ crystal with respect to the substrate surface normal direction and the angle from the substrate surface normal direction in the [111] direction of the crystal of the main electrode layer which is formed through the base layer made of TiN decrease.

When the Y-cut angle of LiTaO$_3$ is the same, the angle from the substrate surface normal direction in the [111] direction of the crystal of the main electrode layer which is formed through the base layer made of TiN is constantly larger than the angle in the Z-axis direction of the LiTaO$_3$ crystal with respect to the substrate surface normal direction.

Moreover, when the substrate is made of LiTaO$_3$ having the Y-cut angle ranging from 36° to 48°, the angle from the substrate normal direction in the [111] direction of the crystal of the main electrode layer is larger than the cut angle of the piezoelectric substrate.

Figure 42:
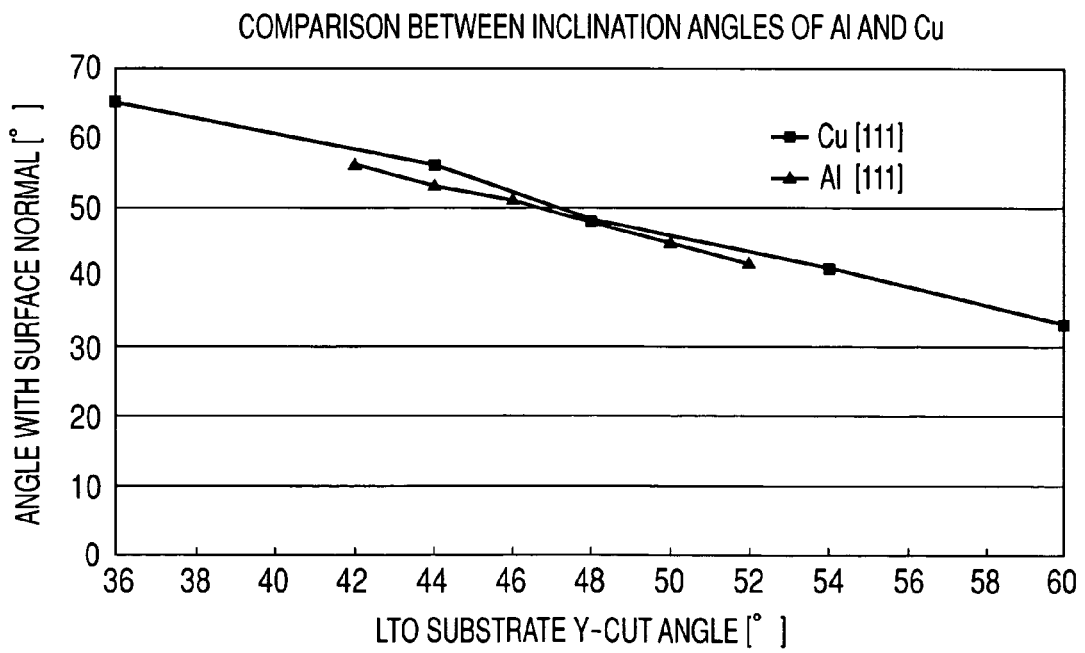
FIG. 42 is a graph showing a relationship between a Y-cut angle of a piezoelectric substrate and an angle to a substrate normal surface in a [111] axis direction of a main electrode layer (a Cu alloy and an Al alloy) of an interdigital electrode section.

FIG. 42 is a graph showing relationships between the angle from the substrate surface normal direction in the [111] direction of the crystal of the main electrode layer made of the AlScCu alloy shown in FIG. 40 and the angle from the substrate surface normal direction in the [111] direction of the crystal of the main electrode layer made of the CuAg alloy shown in FIG. 41, and the Y-cut angle of the LiTaO$_3$.

Referring to FIG. 42, it can be seen that, even when the Y-cut angle of LiTaO$_3$ varies, the angle from the substrate surface normal direction in the [111] direction of the crystal of the main electrode layer made of the AlScCu alloy and the angle from the substrate surface normal direction in the [111] direction of the crystal of the main electrode layer made of the CuAg alloy are approximately equal to each other.

Figure 43:
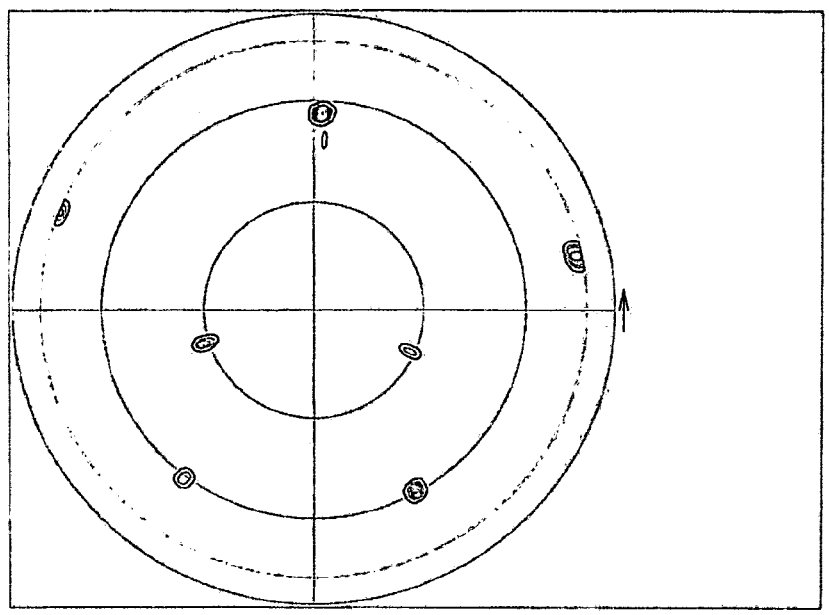
FIG. 43 is an XRD pole figure of a (111) plane of a main electrode layer which is made of an AlScCu alloy and which is film-formed on a piezoelectric substrate made of $LiTaO_3$ having a Y-cut angle of 42° via a base layer made of TiN by sputtering.
Figure 44:
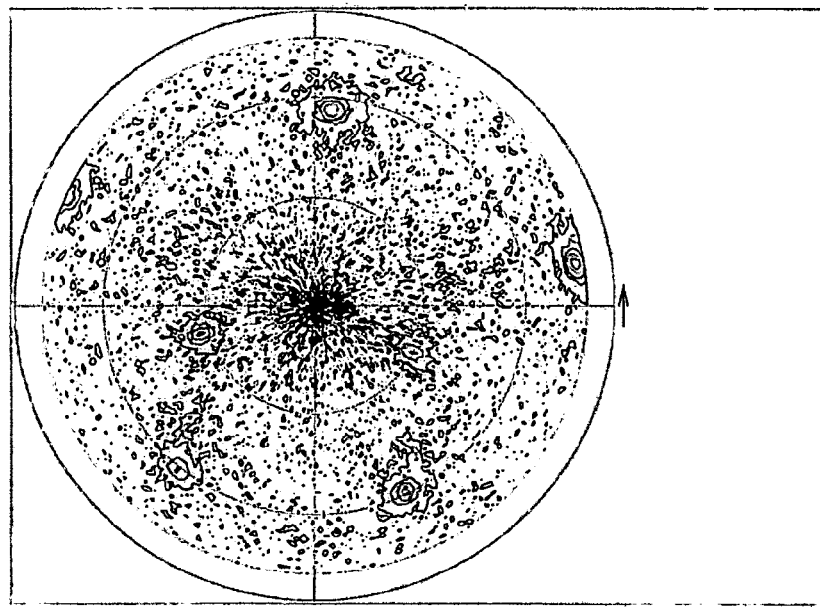
FIG. 44 is an XRD pole figure of a (111) plane of the base layer.
Figure 45:
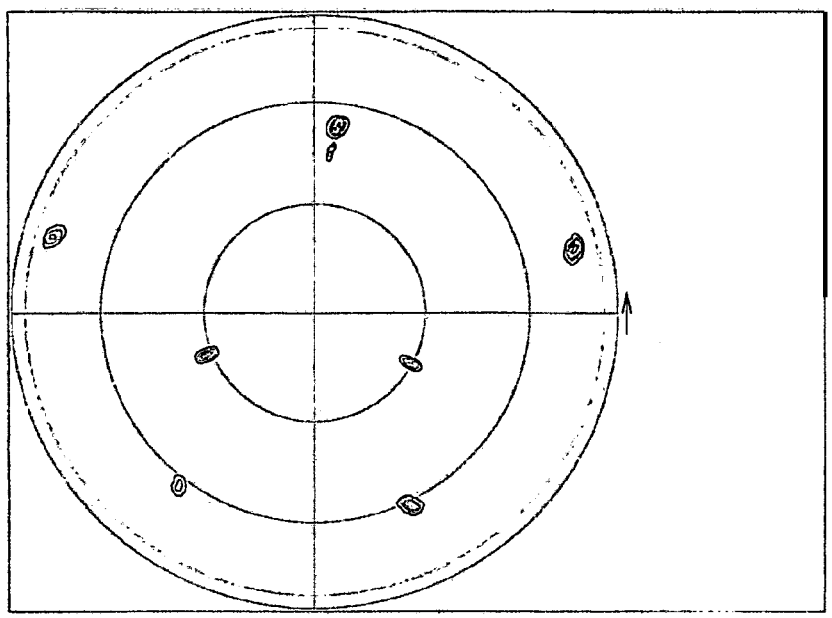
FIG. 45 is an XRD pole figure of a (111) plane of a main electrode layer which is made of an AlScCu alloy and which is film-formed on a piezoelectric substrate made of $LiTaO_3$ having a Y-cut angle of 44° via a base layer made of TiN by sputtering.
Figure 46:
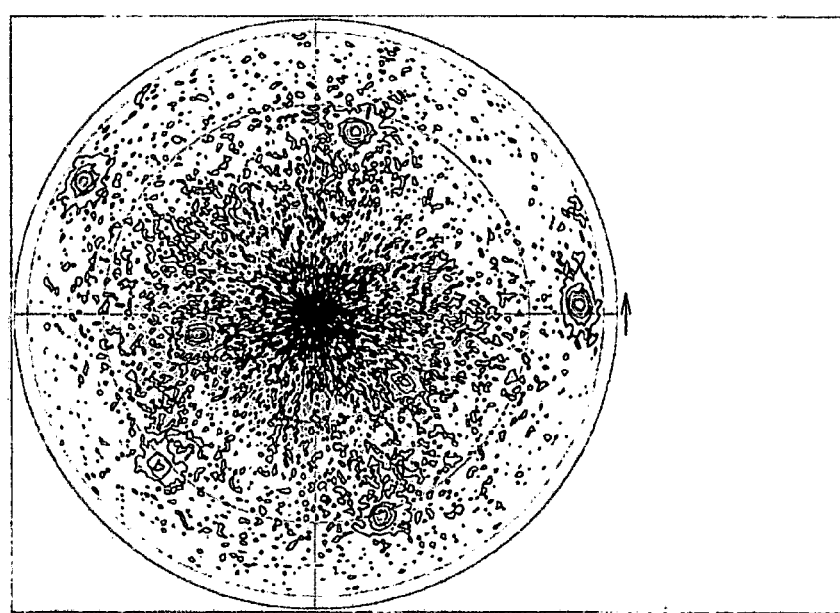
FIG. 46 is an XRD pole figure of a (111) plane of the base layer.
Figure 47:
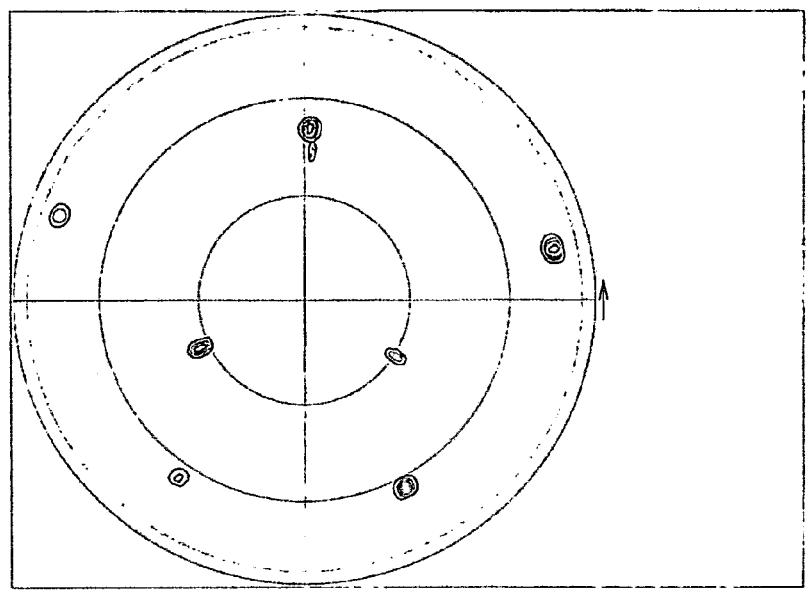
FIG. 47 is an XRD pole figure of a (111) plane of a main electrode layer which is made of an AlScCu alloy and which is film-formed on a piezoelectric substrate made of $LiTaO_3$ having a Y-cut angle of 46° via a base layer made of TiN by sputtering.
Figure 48:
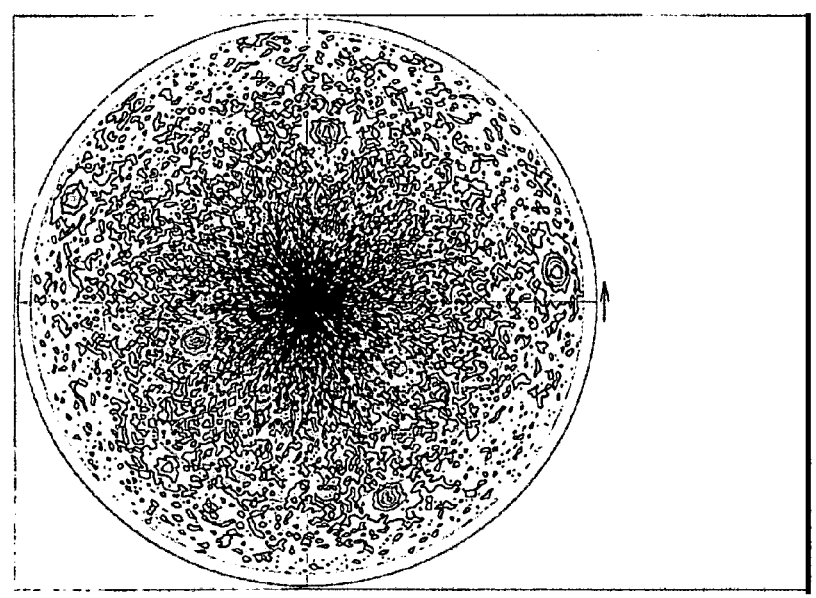
FIG. 48 is an XRD pole figure of a (111) plane of the base layer.
Figure 49:
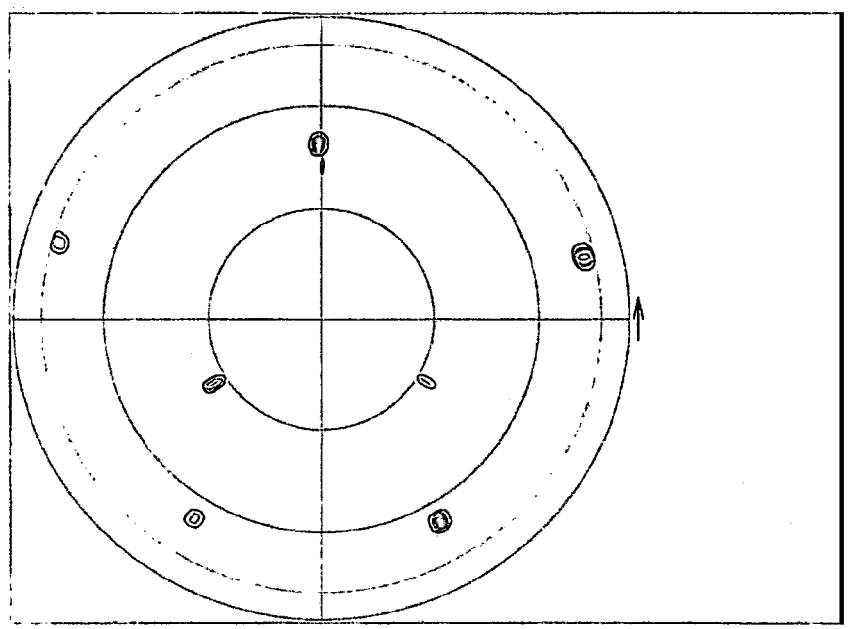
FIG. 49 is an XRD pole figure of a (111) plane of a main electrode layer which is made of an AlScCu alloy and which is film-formed on a piezoelectric substrate made of $LiTaO_3$ having a Y-cut angle of 48° via a base layer made of TiN by sputtering.
Figure 50:
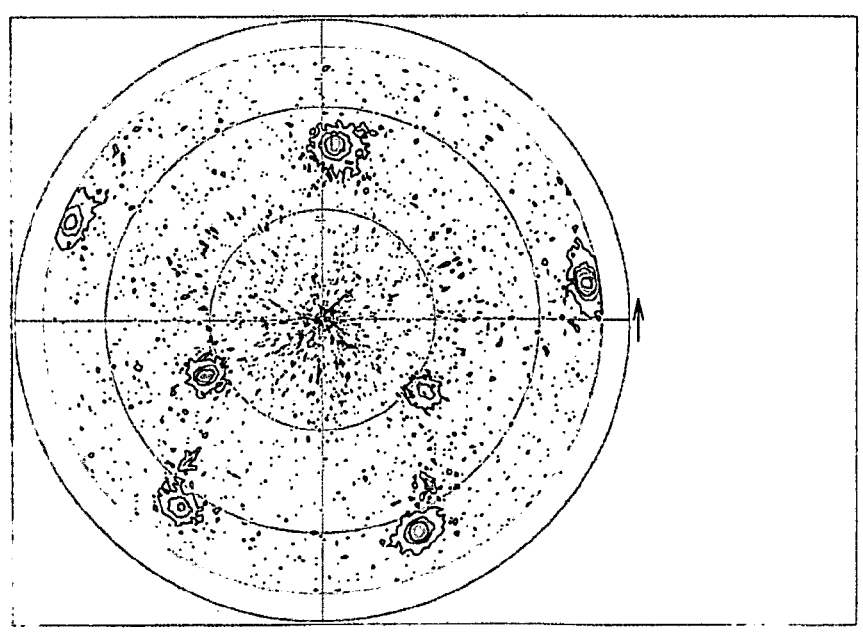
FIG. 50 is an XRD pole figure of a (111) plane of the base layer.
Figure 51:
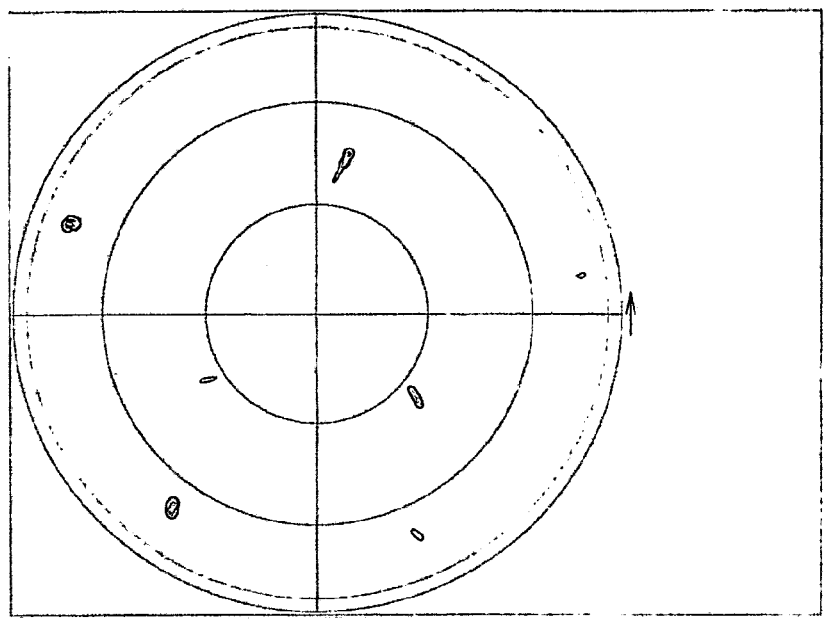
FIG. 51 is an XRD pole figure of a (111) plane of a main electrode layer which is made of an AlScCu alloy and which is film-formed on a piezoelectric substrate made of $LiTaO_3$ having a Y-cut angle of 50° via a base layer made of TiN by sputtering.
Figure 52:
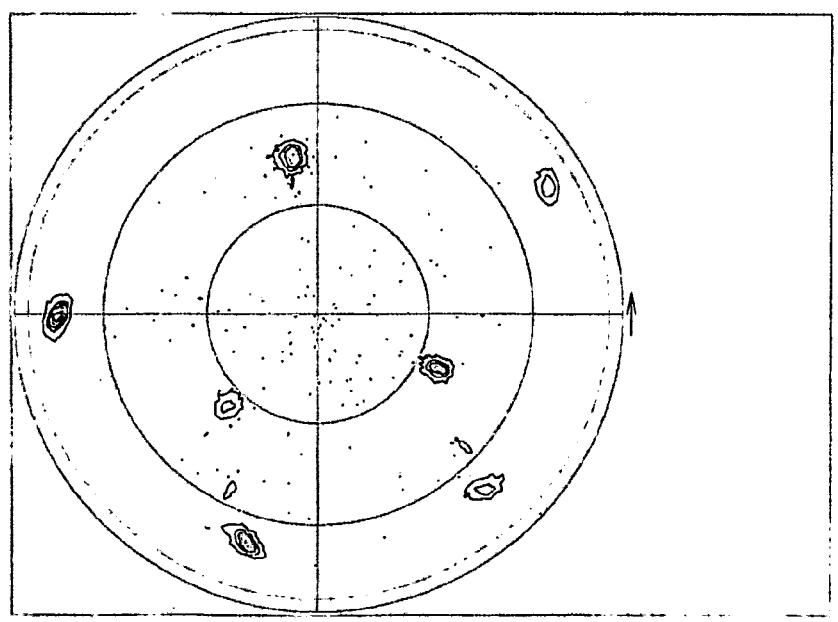
FIG. 52 is an XRD pole figure of a (111) plane of the base layer.
Figure 53:
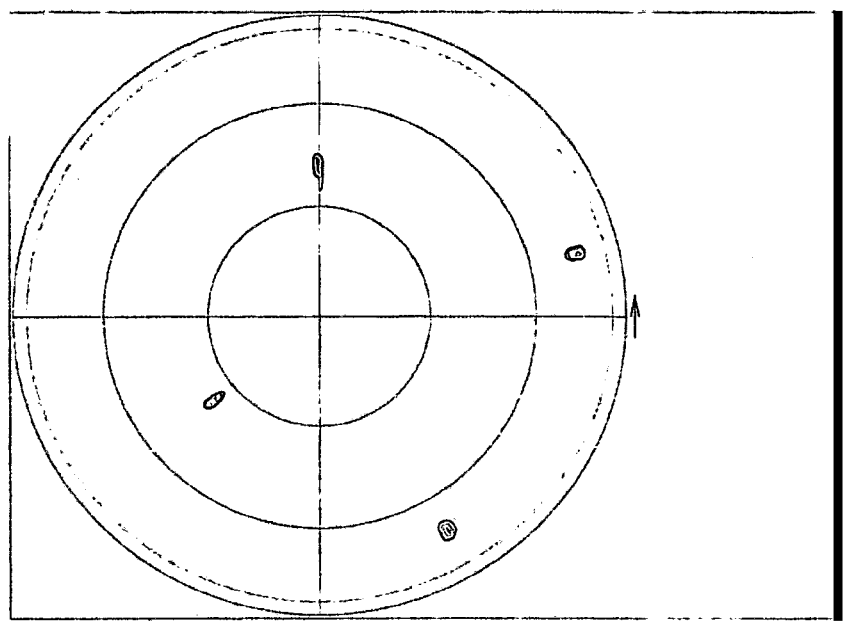
FIG. 53 is an XRD pole figure of a (111) plane of a main electrode layer which is made of an AlScCu alloy and which is film-formed on a piezoelectric substrate made of $LiTaO_3$ having a Y-cut angle of 52° via a base layer made of TiN by sputtering.
Figure 54:
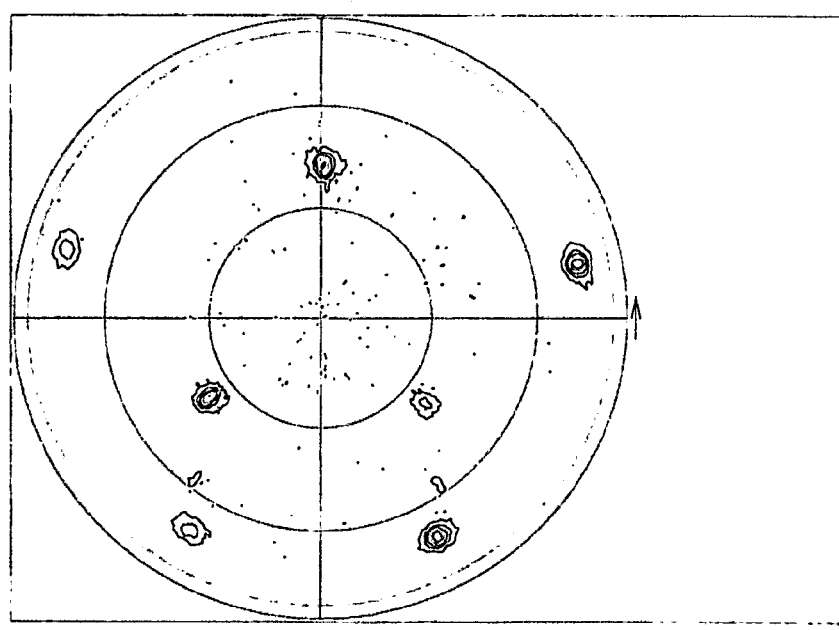
FIG. 54 is an XRD pole figure of a (111) plane of the base layer.

FIG. 43 is an XRD pole figure of the (111) plane of the main electrode layer, made of the AlScCu alloy, which is film-formed on the piezoelectric substrate made of LiTaO$_3$ having the Y-cut angle of 42°, through the base layer made of TiN by the sputter method. FIG. 44 is an XRD pole figure of the (111) plane of the base layer.

A spot of the XRD pole figure of FIG. 43 indicates that the angle from the substrate surface normal direction in the [111] direction of the crystal of the main electrode layer is 56°. Further, a spot position of the (111) plane in the XRD pole figure of the crystal of the main electrode layer of FIG. 43 and a spot position of the (111) plane in the XRD pole figure of the crystal of the base layer shown in FIG. 44 are aligned with each other. That is, the crystals of the main electrode layer are epitaxially or heteroepitaxially grown on the crystals of the base layer.

FIGS. 45, 47, 49, 51, and 53 are XRD pole figures of the (111) planes of the main electrode layers, made of the AlScCu alloy, which are film-formed on the piezoelectric substrates made of LiTaO$_3$ having the Y-cut angles of 44°, 46°, 48°, 50°, and 52°, through the base layers made of TiN by the sputter method respectively. FIGS. 46, 48, 50, 52, and 54 are XRD pole figures the (111) planes of the base layers respectively.

Referring to FIGS. 45 to 54, it can be seen that the spot position of the (111) plane in the XRD pole figure of the crystal of the main electrode layer and the spot position of the (111) plane in the XRD pole figure of the crystal of the base layer are aligned with each other. That is, the crystals of the main electrode layer are epitaxially or heteroepitaxially grown on the crystals of the base layer.

Figure 55:
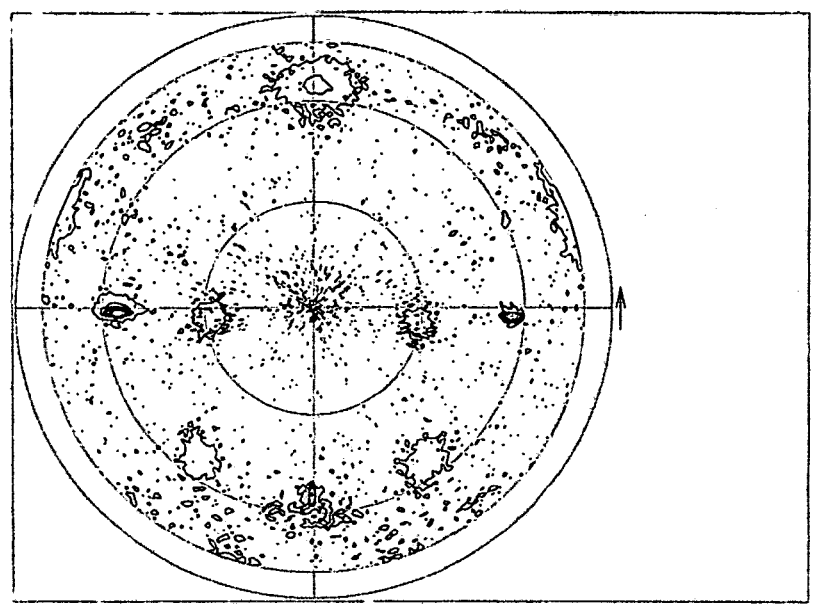
FIG. 55 is an XRD pole figure of a (111) plane of a main electrode layer which is made of a CuAg alloy and which is film-formed on a piezoelectric substrate made of $LiTaO_3$ having a Y-cut angle of 36° via a base layer made of TiN by sputtering.
Figure 56:
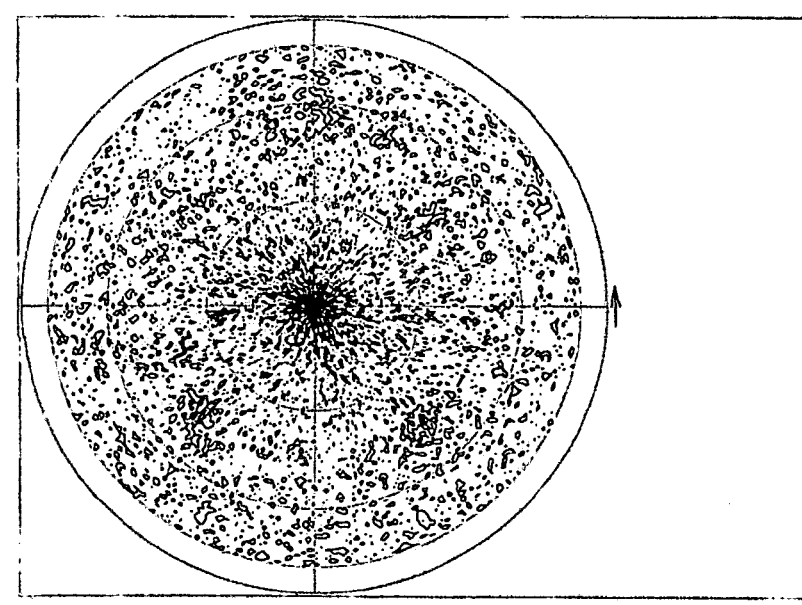
FIG. 56 is an XRD pole figure of a (111) plane of the base layer.
Figure 57:
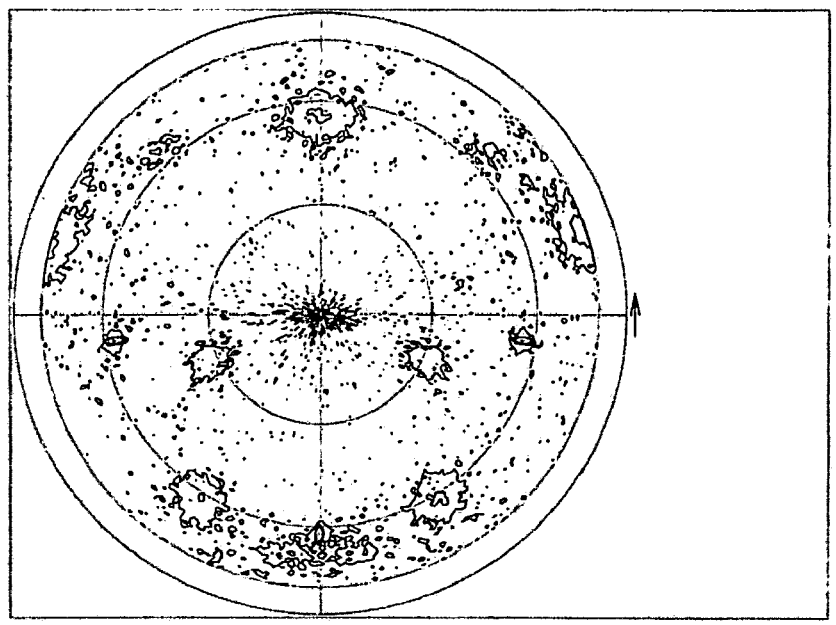
FIG. 57 is an XRD pole figure of a (111) plane of a main electrode layer which is made of a CuAg alloy and which is film-formed on a piezoelectric substrate made of $LiTaO_3$ having a Y-cut angle of 44° via a base layer made of TiN by sputtering.
Figure 58:
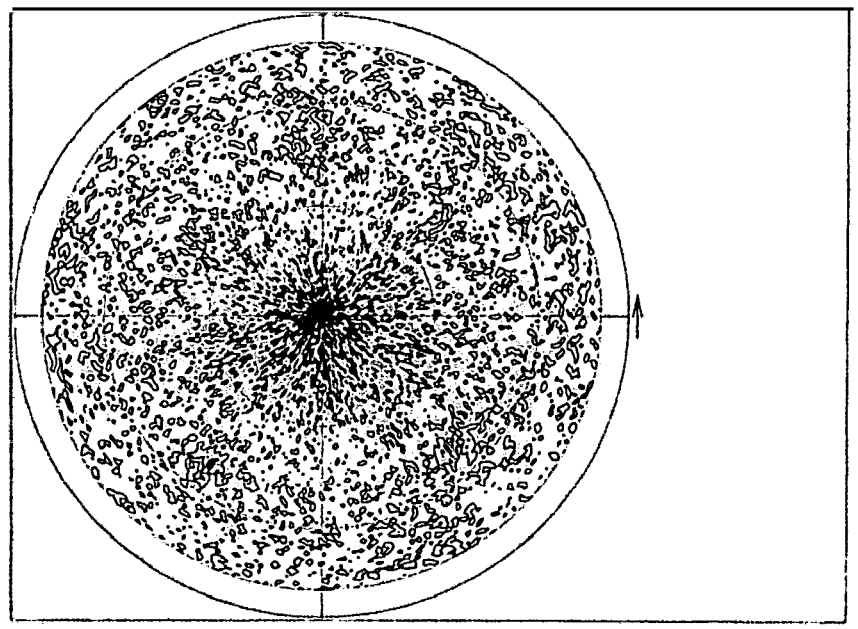
FIG. 58 is an XRD pole figure of a (111) plane of the base layer.
Figure 59:
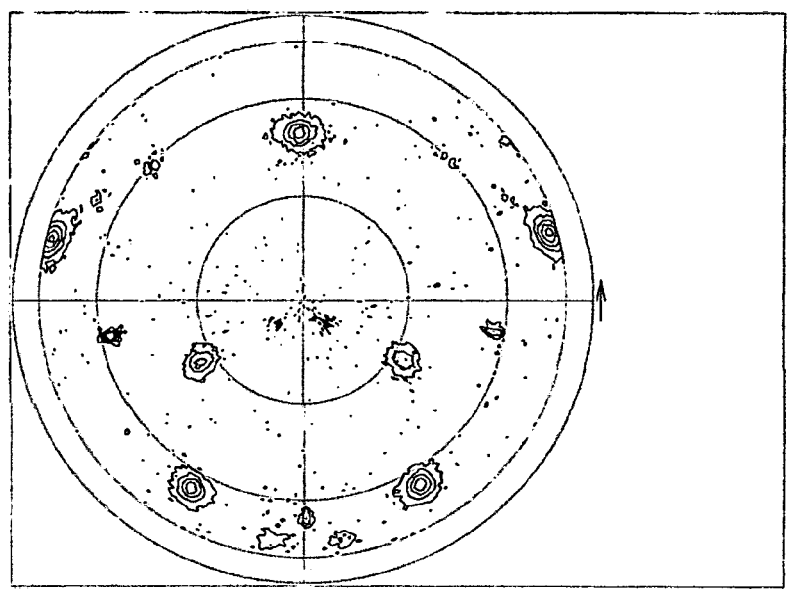
FIG. 59 is an XRD pole figure of a (111) plane of a main electrode layer which is made of a CuAg alloy and which is film-formed on a piezoelectric substrate made of $LiTaO_3$ having a Y-cut angle of 48° via a base layer made of TiN by sputtering.
Figure 60:
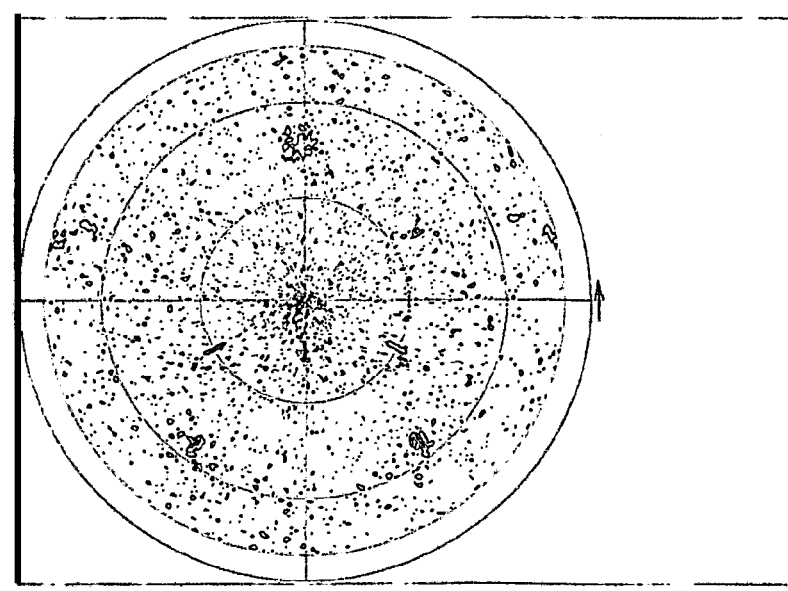
FIG. 60 is an XRD pole figure of a (111) plane of the base layer.
Figure 61:
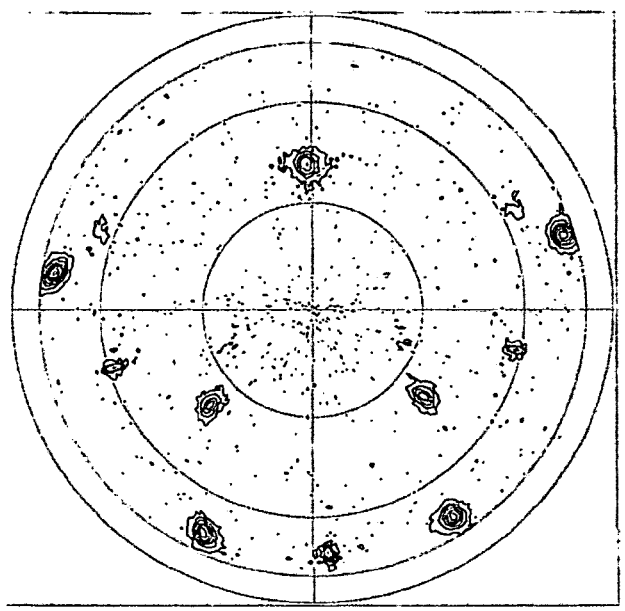
FIG. 61 is an XRD pole figure of a (111) plane of a main electrode layer which is made of a CuAg alloy and which is film-formed on a piezoelectric substrate made of $LiTaO_3$ having a Y-cut angle of 54° via a base layer made of TiN by sputtering.
Figure 62:
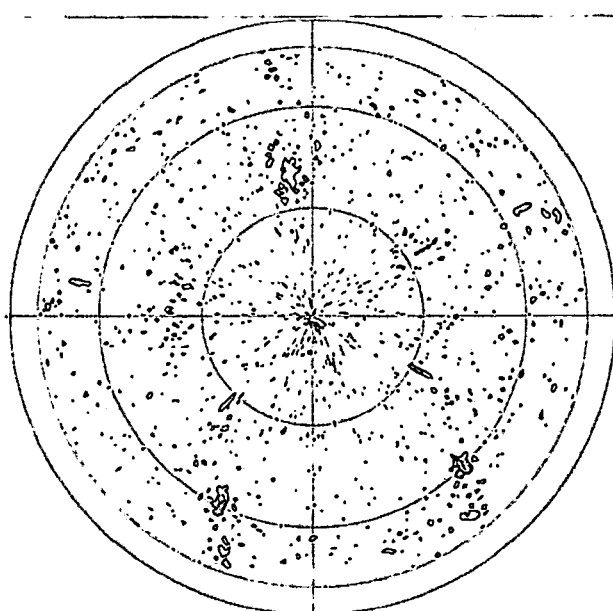
FIG. 62 is an XRD pole figure of a (111) plane of the base layer.
Figure 63:
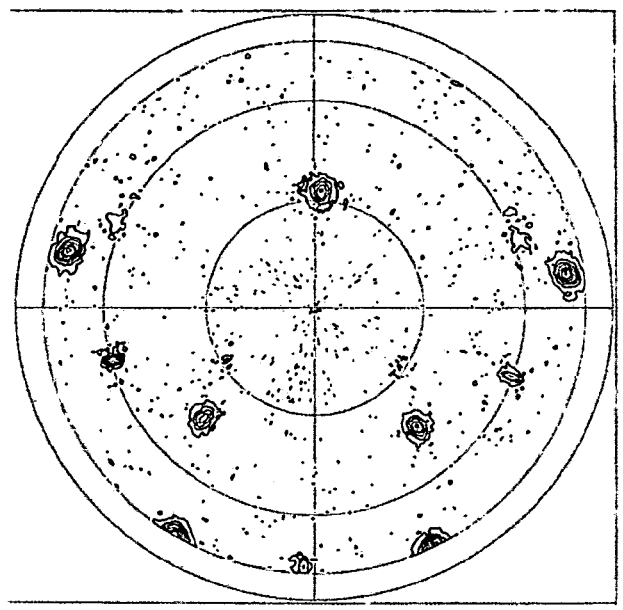
FIG. 63 is an XRD pole figure of a (111) plane of a main electrode layer which is made of a CuAg alloy and which is film-formed on a piezoelectric substrate made of $LiTaO_3$ having a Y-cut angle of 60° via a base layer made of TiN by sputtering.
Figure 64:
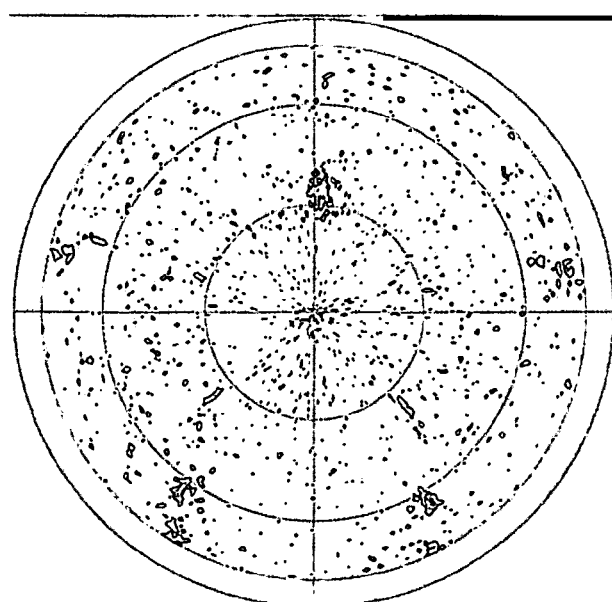
FIG. 64 is an XRD pole figure of a (111) plane of the base layer.

FIG. 55 is an XRD pole figure of the (111) plane of the main electrode layer, made of the CuAg alloy, which is film-formed on the piezoelectric substrate made of LiTaO$_3$ having the Y-cut angle of 36°, through the base layer, made of TiN, which has the film thickness of 5 nm, by the sputter method. FIG. 56 is an XRD pole figure of the (111) plane of the base layer. The film thickness of the main electrode layer is 80 nm.

Referring to FIG. 55, the spot of the XRD pole figure indicates that the angle from the substrate surface normal direction in the [111] direction of the crystal of the main electrode layer is 65°. Further, the spot position of the (111) plane in the XRD pole figure of the crystal of the main electrode layer of FIG. 55 and the spot position of the (111) plane in the XRD pole figure of the crystal of the base layer shown in FIG. 56 are aligned with each other. That is, the crystals of the main electrode layer are epitaxially or heteroepitaxially grown on the crystals of the base layer.

FIGS. 57, 59, 61, and 63 are XRD pole figures of the (111) planes of the main electrode layers, made of the CuAg alloy, which are film-formed on the piezoelectric substrates made of LiTaO$_3$ having the Y-cut angles of 44°, 48°, 54°, and 60°, through the base layers made of TiN by the sputter method respectively. FIGS. 58, 60, 62, and 64 are XRD pole figures of the (111) planes of the base layers respectively.

Referring to FIGS. 57 to 64, it can be seen that the spot position of the (111) plane in the XRD pole figure of the crystal of the main electrode layer and the spot position of the (111) plane in the XRD pole figure of the crystal of the base layer are aligned with each other. That is, the crystals of the main electrode layer are epitaxially or heteroepitaxially grown on the crystals of the base layer.

Next, resistance to electromigration of the electrode of which the main electrode layer made of the AlScCu alloy is film-formed on the piezoelectric substrate made of LiTaO$_3$ having the Y-cut angle of 46° through the base layer by means of the sputter method is examined.

The measurement of resistance to electromigration is performed by measuring a resistance, when input current is applied to both ends of an electrode pattern from a direct current (DC) power supply such as the 6612C from Agilent Technologies, with a multimeter such as the 34401A from Agilent Technologies. And then, resistance to electromigration is evaluated according to the time when the resistance variation exceeds 10 percent of its initial value.

Dimensions of the electrode pattern used for the measurement are described below.

Width of electrode: 30 μm

Length of electrode: 300 μm

Film thickness of Al alloy layer of electrode: 150 nm

In the electrode pattern of the example, the base layer is formed with TiN (the film thickness of 10 nm). In the electrode pattern of the comparative example, the base layer is formed with Ti (the film thickness of 10 nm; the comparative example 1) or Mo (the film thickness of 10 nm; the comparative example 2).

Figure 65:
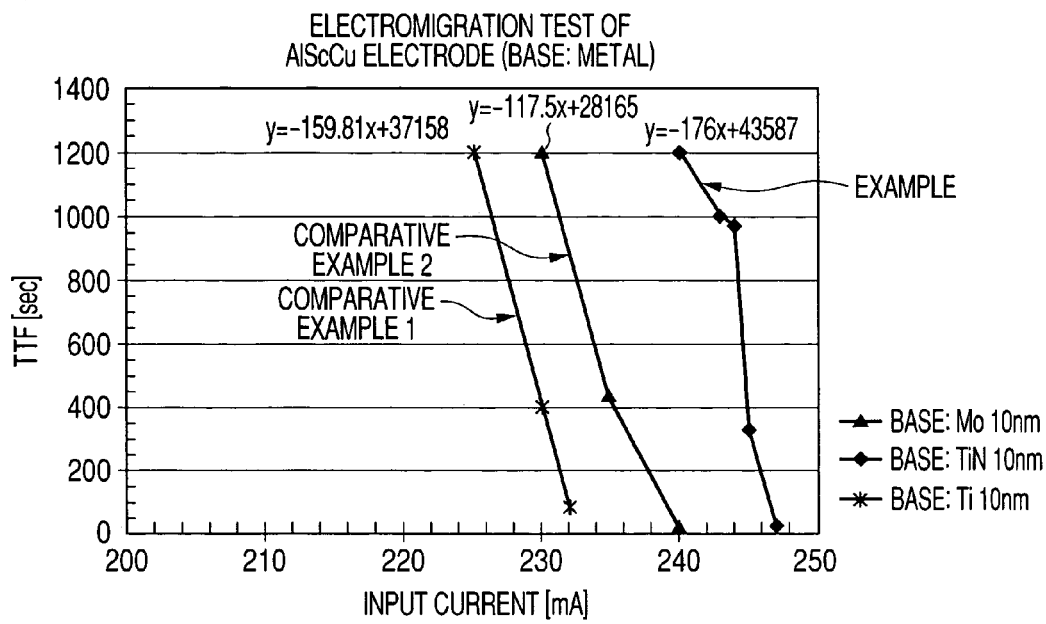
FIG. 65 is a graph showing a relationship between a material of a base layer of an electrode and resistance to electromigration of the electrode.

The result is shown in FIG. 65. Resistance to electromigration is enhanced in an order of the comparative example 1, the comparative example 2, and the example. In the electrode pattern of the example, the electrode breakage is not observed even when the input current is 240 mA. To the contrary, in the electrode patterns of the comparative examples 1 and 2, when the input current is 240 mA, the electrodes are completely damaged.

Figure 66:
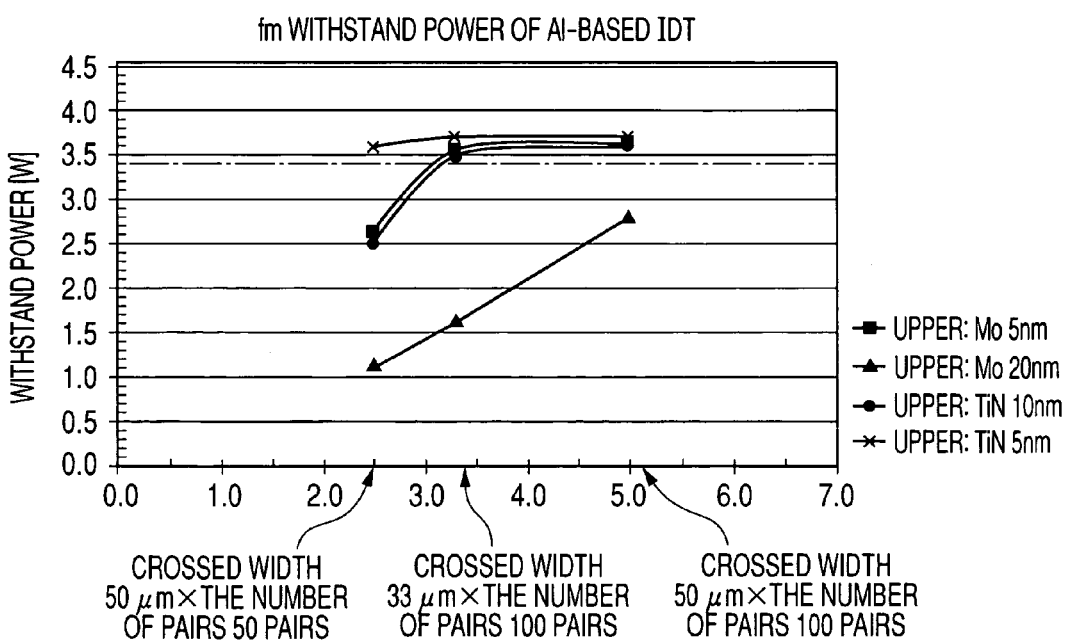
FIG. 66 is a graph showing a relationship between a material of a protective layer of an interdigital electrode section and withstand power of the interdigital electrode section.

FIG. 66 is a graph showing withstand power when the surface acoustic wave device is formed by film-forming the main electrode layer made of the AlScCu alloy on the piezoelectric substrate made of LiTaO$_3$ having the Y-cut angle of 46° through the base layer TiN (the film thickness of 10 nm) by means of the sputter method and by depositing the protective film thereon. The horizontal axis of the graph represents a product of the crossed width (mm) of the pair of the interdigital electrodes and the number of pieces (pairs), and the vertical axis thereof represents withstand power.

As for the measurement of withstand power, a predetermined input frequency generated with a signal generator such as the 2041 from MARCONI Ins. is amplified with a RF power amplifier such as the A250HP-R from R&B to generate an input signal and the input signal is applied via the terminal portion of the surface acoustic wave device. And then, the input signal and the output signal are measured with a power meter such as the E4419B from Agilent Technologies. The withstand power is evaluated according to the power of the input signal at the time when the surface acoustic wave device is broken.

Dimensions of the interdigital electrode section of the surface acoustic wave device used for the examination are described below.

Width of electrode fingers of interdigital electrode section: 0.5 μm

Pitch of electrode fingers of interdigital electrode section: 0.5 μm

Length of electrode fingers of interdigital electrode section: 33 μm or 50 μm

Film thickness of Al alloy layer of interdigital electrode section: 120 nm

Moreover, the input frequency f0 to the surface acoustic wave device satisfies an expression of f0=(resonant frequency fr+antiresonant frequency far)/2.

Referring to FIG. 66, the surface acoustic wave device in which the protective layer made of TiN is deposited to have a film thickness of 5 nm has the highest withstand power.

If the protective layer made of TiN is deposited to have the film thickness of 5 nm, even when the product of the crossed width (mm) of the interdigital electrode sections and the number of pieces (pairs) becomes small, that is, even when the electrical capacitance between the interdigital electrode sections becomes small, withstand power is maintained. TiN has a high melting point and the crystal structure thereof is not likely to be disturbed as compared to Al. Further, TiN is lighter in weight than Mo and is not likely to be diffused into Al as compared to Ti. If the protective layer made of TiN is deposited on the Al alloy layer, the crystal structure of the Al alloy layer is stabilized, and thus electromigration or stress migration is prevented from occurring. Further, chemical resistance of the Al alloy layer also is enhanced.

Figure 67:
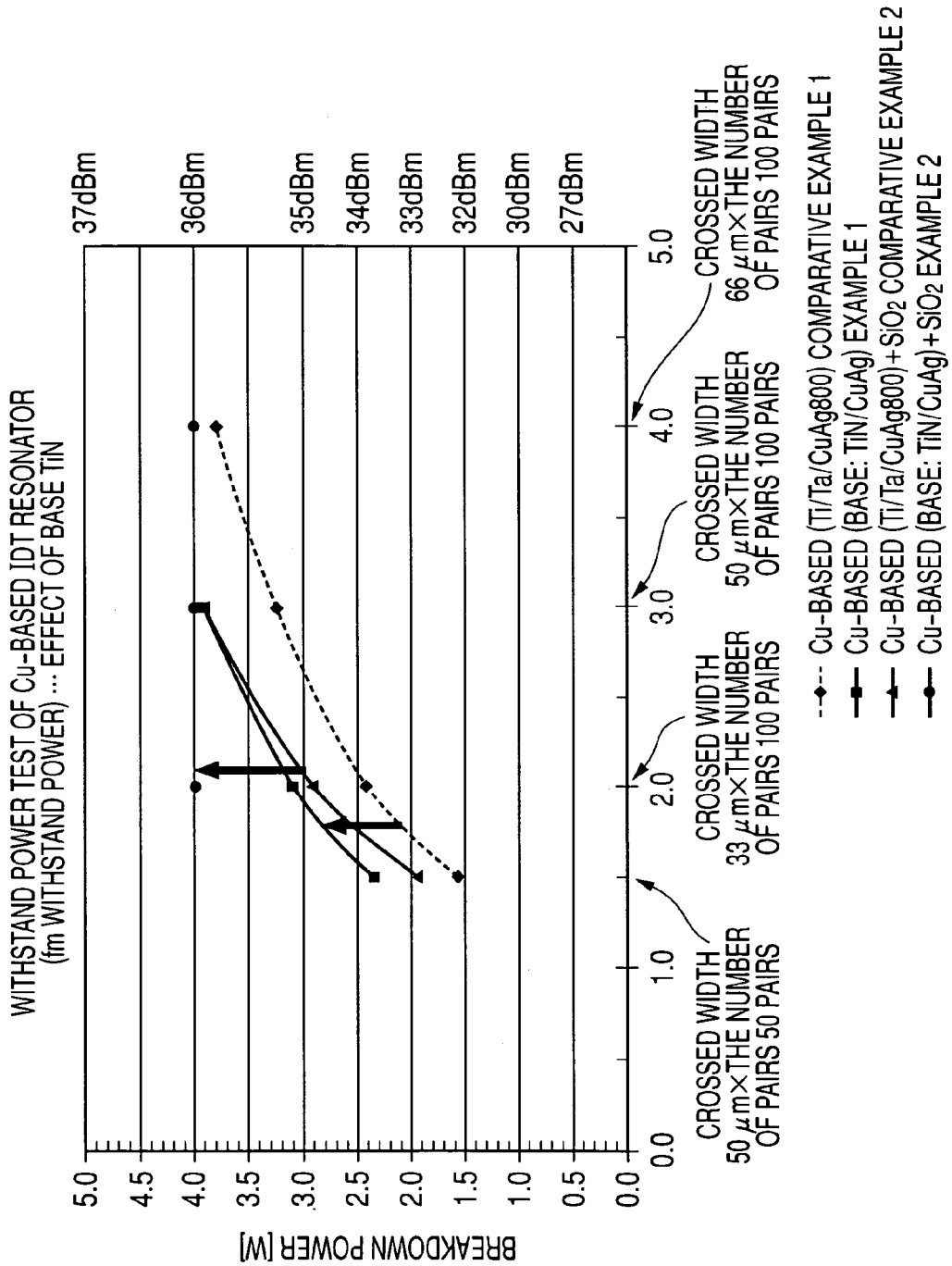
FIG. 67 is a graph showing a relationship between a material of a base layer of an interdigital electrode section and withstand power of the interdigital electrode section.

FIG. 67 is a graph showing withstand power when the surface acoustic wave device is formed by film-forming the main electrode layer (the film thickness of 80 nm) made of the CuAg alloy on the piezoelectric substrate made of LiTaO$_3$ having the Y-cut angle of 48° through the base layer by means of the sputter method. The comparative example 1 in which the base layer is made of a Ti/Ta laminated film, the example 1 in which the base layer is made of the TiN film, the comparative example 2 in which the base layer is made of the Ti/Ta laminated film, and the piezoelectric substrate and the interdigital electrode section are covered with SiO$_2$, and the example 2 in which the base layer is made of the TiN film, and the piezoelectric substrate and the interdigital electrode section are covered with SiO$_2$ are examined.

The horizontal axis of the graph represents the product of the crossed width (mm) of the pair of the interdigital electrodes and the number of pieces (pairs), and the vertical axis thereof represents withstand power.

As for the measurement of withstand power, a predetermined input frequency generated with the signal generator such as the 2041 from MARCONI Ins. is amplified with the RF power amplifier such as the A250HP-R from R&K to generate the input signal and the input signal is applied via the terminal portion of the surface acoustic wave device. And then, the input signal and the output signal are measured with the power meter such as the E4419B from Agilent Technologies. The withstand power is evaluated according to the power of the input signal at the time when the surface acoustic wave device is broken. A maximum power of the input signal is 4 W.

Dimensions of the interdigital electrode section of the surface acoustic wave device used for the examination are described below.

Width of electrode fingers of interdigital electrode section: 0.5 μm

Pitch of electrode fingers of interdigital electrode section: 0.5 μm

Length of electrode fingers of interdigital electrode section: 33 μm or 50 μm

Film thickness of Al alloy layer of interdigital electrode section: 120 nm

Moreover, the input frequency f0 to the surface acoustic wave device satisfies an expression of f0=(resonant frequency fr+antiresonant frequency far)/2.

Referring to FIG. 67, it can be seen that, when the product of the crossed width (mm) of the interdigital electrode sections and the number of pieces (pairs) is the same, the surface acoustic wave device according to the example 1 in which the base layer is made of the TiN film has breakdown power larger than that of the surface acoustic wave device according to the comparative example 1 by about 1 W. Further, it can be seen that, when the product of the crossed width (mm) of the interdigital electrode sections and the number of pieces (pairs) is the same, the surface acoustic wave device according to the example 2 in which the base layer is made of the TiN film has breakdown power larger than that of the surface acoustic wave device according to the comparative example 2 by about 1 W. Moreover, in the surface acoustic wave device according to the example 2, the electrode breakage is not observed even when the input signal having the maximum power of 4 W is applied thereto.

As is apparent from the result of FIG. 67, even when the product of the crossed width (mm) of the interdigital electrode sections and the number of pieces (pairs) becomes small, that is, even when the electrical capacitance between the interdigital electrode sections becomes small, the surface acoustic wave devices in the examples 1 and 2 have withstand power larger than that of the surface acoustic wave device of the comparative example.

Figure 68:
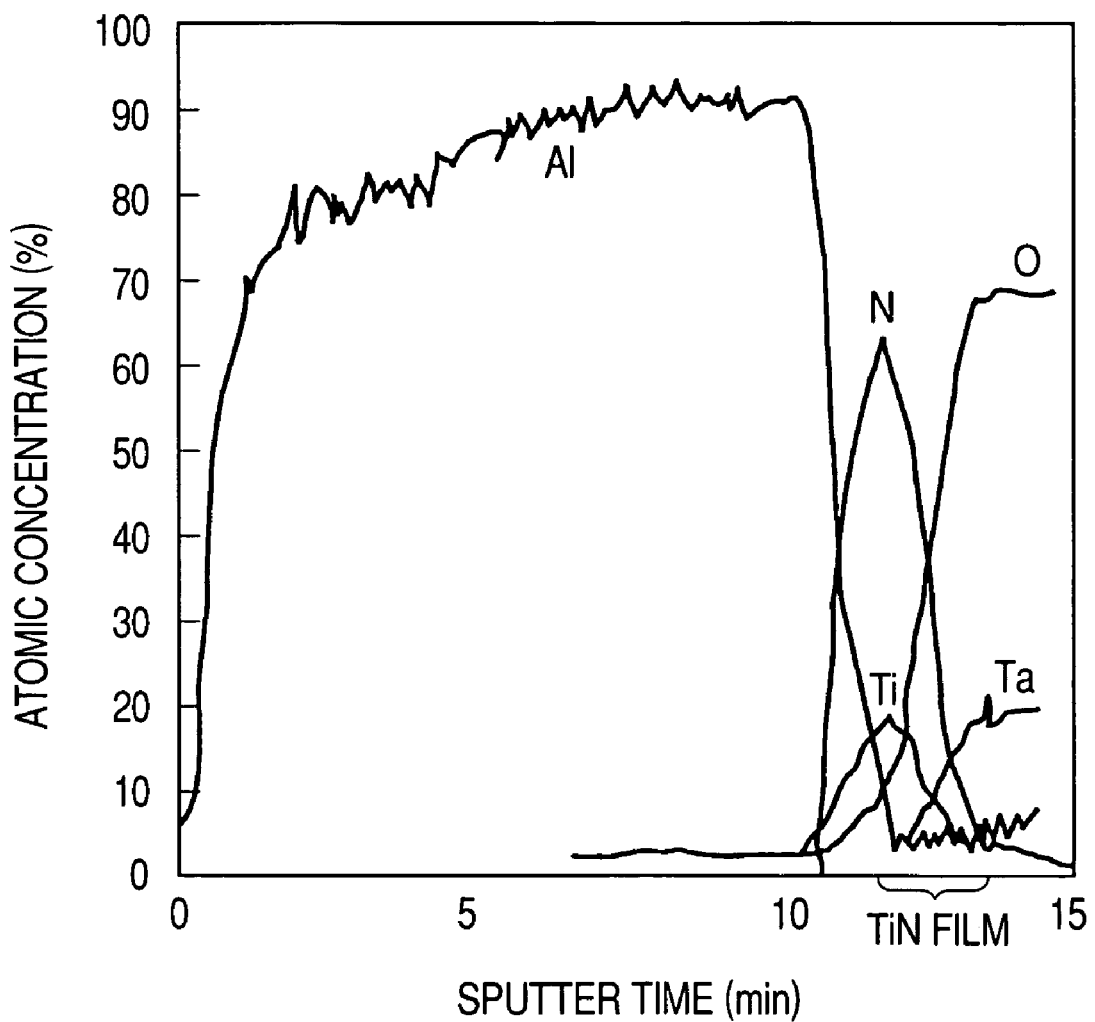
FIG. 68 is a graph showing a composition distribution in a depth direction which is measured by an AES (auger electron spectroscopy) analysis device in an example 1 in which a base layer is formed with TiN.
Figure 69:
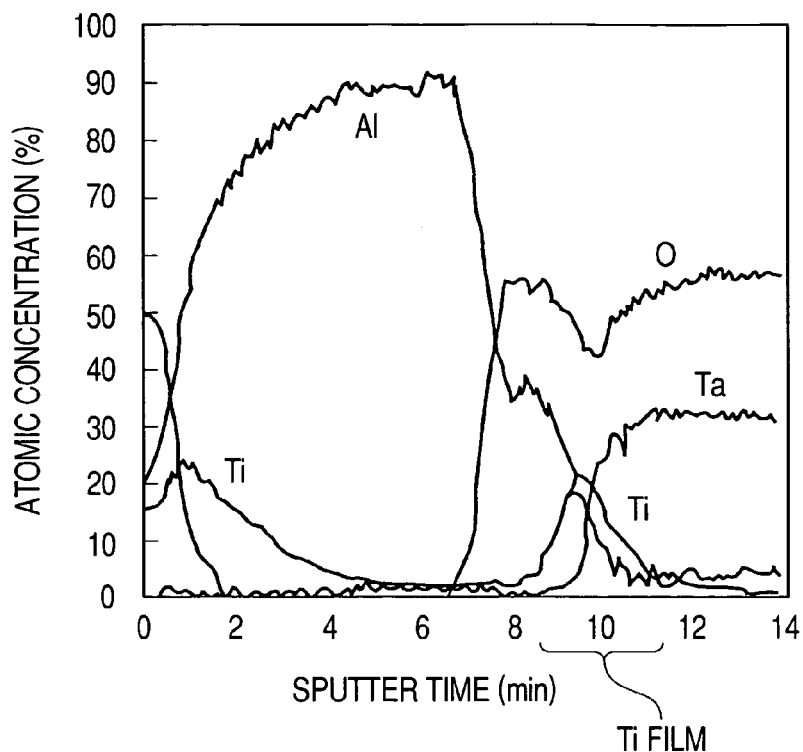
FIG. 69 is a graph showing a composition distribution in a depth direction which is measured by an AES analysis device in a comparative example 1 in which a base layer is formed with Ti.

FIGS. 68 and 69 show composition distribution in a depth direction measured with an AES (auger electron spectroscopy) analysis device to the example 1 in which the base layer is formed with TiN and the comparative example 1 in which the base layer is formed with Ti respectively.

In FIG. 69, the base layer Ti and a portion of the main electrode layer (the Al alloy layer) which contacts the base layer combines with oxygen of $LiTaO_3$ of the piezoelectric substrate, and $LiTaO_3$ of the piezoelectric substrate is deprived of oxygen. If the Al alloy layer is oxidized, the resistance of the electrode increases, and if $LiTaO_3$ of the piezoelectric substrate losses oxygen, it is not preferable for surface acoustic waves to propagate.

In FIG. 68, oxygen of $LiTaO_3$ of the piezoelectric substrate is blocked by the base layer TiN and does not combine with the Al alloy layer. Thus, there is no case in which oxygen of $LiTaO_3$ of the piezoelectric substrate is deprived. Therefore, a favorable interface can be formed.

Figure 70:
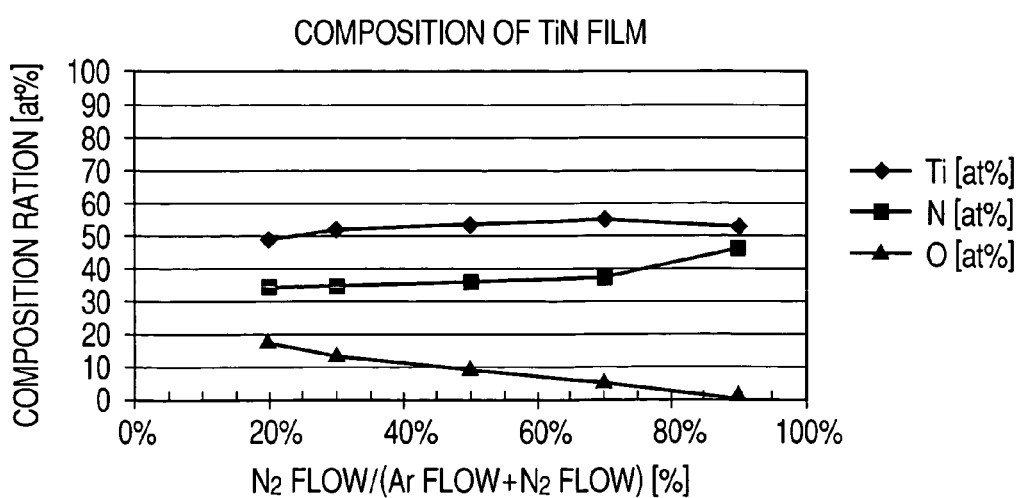
FIG. 70 is a graph showing a composition and a film-forming condition of a TiN film which is film-formed by means of a sputter method.

FIG. 70 shows a composition and a film-forming condition of the TiN film which is film-formed by means of the sputter method.

If a $N_2$ flow ratio (=$N_2$ flow/(Ar flow+$N_2$ flow)) changes, the composition ratio of Ti and N and the oxygen content of the TiN film changes, but all are favorably used as the TiN film for the base layer and the protective layer.

Figure 71:
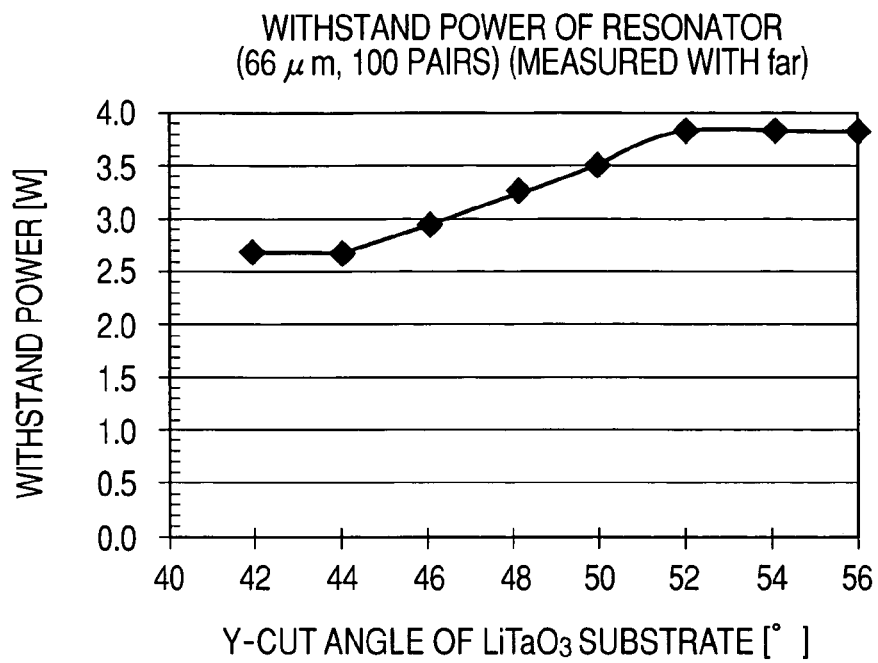
FIG. 71 is a graph showing withstand power of a resonator in which a surface acoustic wave device is formed by film-forming an Al alloy layer (film thickness of 165 nm) made of an AlScCu alloy on a piezoelectric substrate made of LiTaO$_3$, having a Y-cut angle changed, through a base layer TiN (film thickness of 20 nm) by means of a sputter method and by depositing a protective film TiN (film thickness of 10 nm) thereon.
Figure 72:
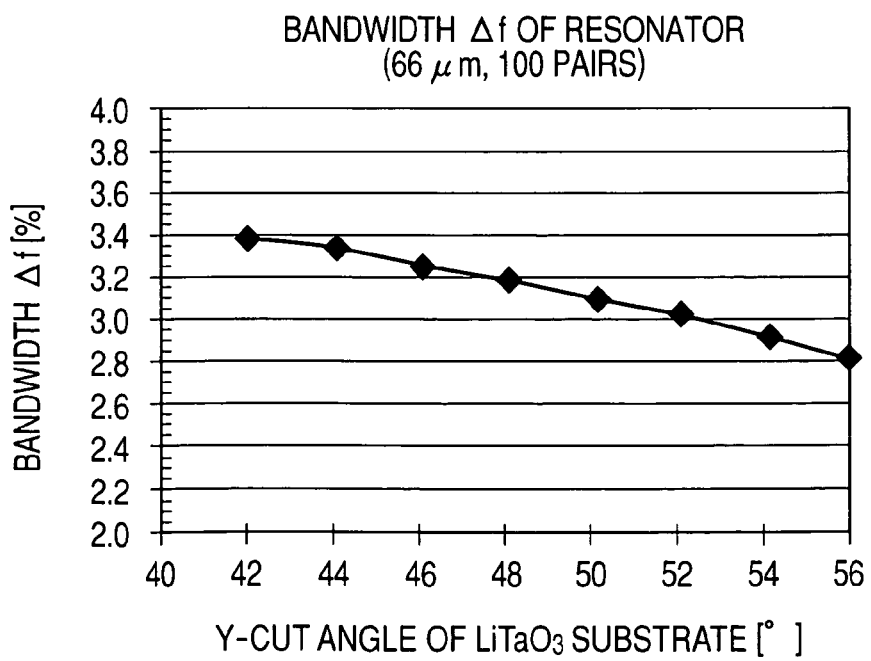
FIG. 72 is a graph showing a bandwidth Δf of a resonator in which a surface acoustic wave device is formed by film-forming an al alloy layer (film thickness of 165 nm) made of an AlScCu alloy on a piezoelectric substrate made of LiTaO$_3$, having a Y-cut angle changed, through a base layer TiN (film thickness of 20 nm) by means of a sputter method and by depositing a protective film TiN (film thickness of 10 nm) thereon.

FIGS. 71 and 72 are graphs respectively showing withstand power and bandwidth Δf of a resonator in which the surface acoustic wave device is formed by film-forming the main electrode layer (the film thickness of 165 nm) made of the AlScCu alloy on the piezoelectric substrate made of $LiTaO_3$, having a Y-cut angle changed, through the base layer TiN (the film thickness of 20 nm) by means of the sputter method and by depositing the protective film TiN (the film thickness of 10 nm) thereon.

The vertical axis of FIG. 71 represents withstand power measured at the antiresonant frequency far when the resonator having the pair of interdigital electrodes (the crossed width 66 μm and 100 pairs) is broken.

The vertical axis of FIG. 72 represents the bandwidth Δf=(far−fr)/fr. The resonant frequency fr and the antiresonant frequency far of the surface acoustic wave device resonator are measured by a network analyzer such as the MS4662A from Anritsu Company.

Withstand power of the resonator is sufficiently as large as 2.5 W. In particular, as the Y-cut angle of the $LiTaO_3$ substrate becomes large, withstand power is enhanced (the measurement limit of 3.8 W). However, if the Y-cut angle of the $LiTaO_3$ substrate is excessively large, the bandwidth Δf of the resonator narrows. Thus, the resonator deteriorates.

In order to obtain a desirable property from a high frequency filter into which the resonator is incorporated, the bandwidth Δf of the resonator is preferably more than 3 percent. Specifically, when the main electrode layer is made of the AlScCu alloy, the Y-cut angle of the $LiTaO_3$ substrate is preferably in a range of from 42° to 52°.

Figure 73:
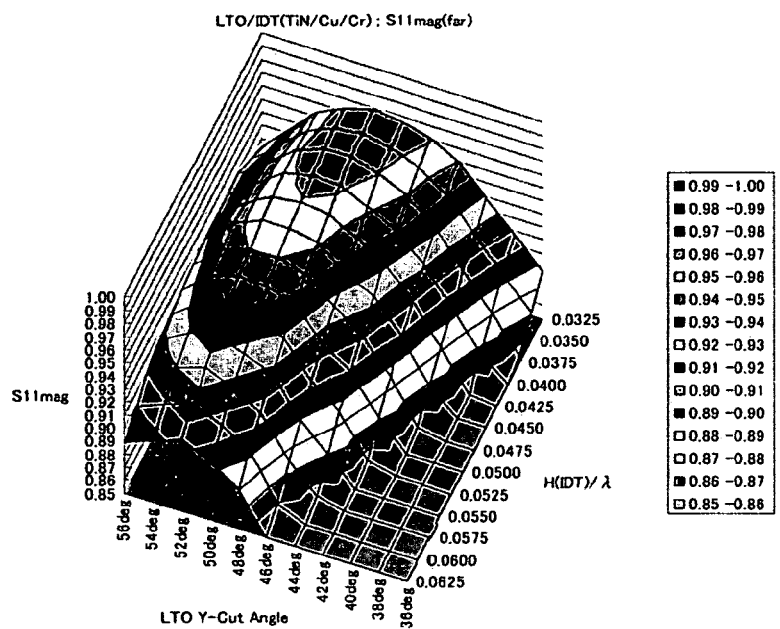
FIG. 73 is a graph showing a reflection coefficient $S_{11}$ of a resonator in which a surface acoustic wave device is formed by film-forming a main electrode layer made of a CuAg alloy on a piezoelectric substrate made of LiTaO$_3$, having a Y-cut angle changed, through a base layer TiN by means of a sputter method and by depositing a protective film Cr thereon.
Figure 74:
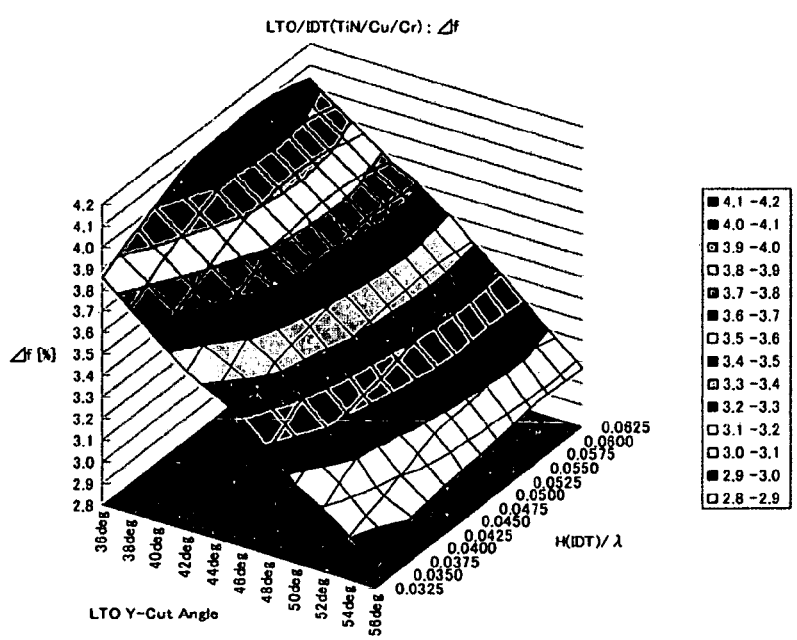
FIG. 74 is a graph showing a bandwidth Δf of a resonator in which a surface acoustic wave device is formed by film-forming a main electrode layer made of a CuAg alloy on a piezoelectric substrate made of LiTaO$_3$, having a Y-cut angle changed, through a base layer TiN by means of a sputter method and by depositing a protective film Cr thereon.
Figure 75:
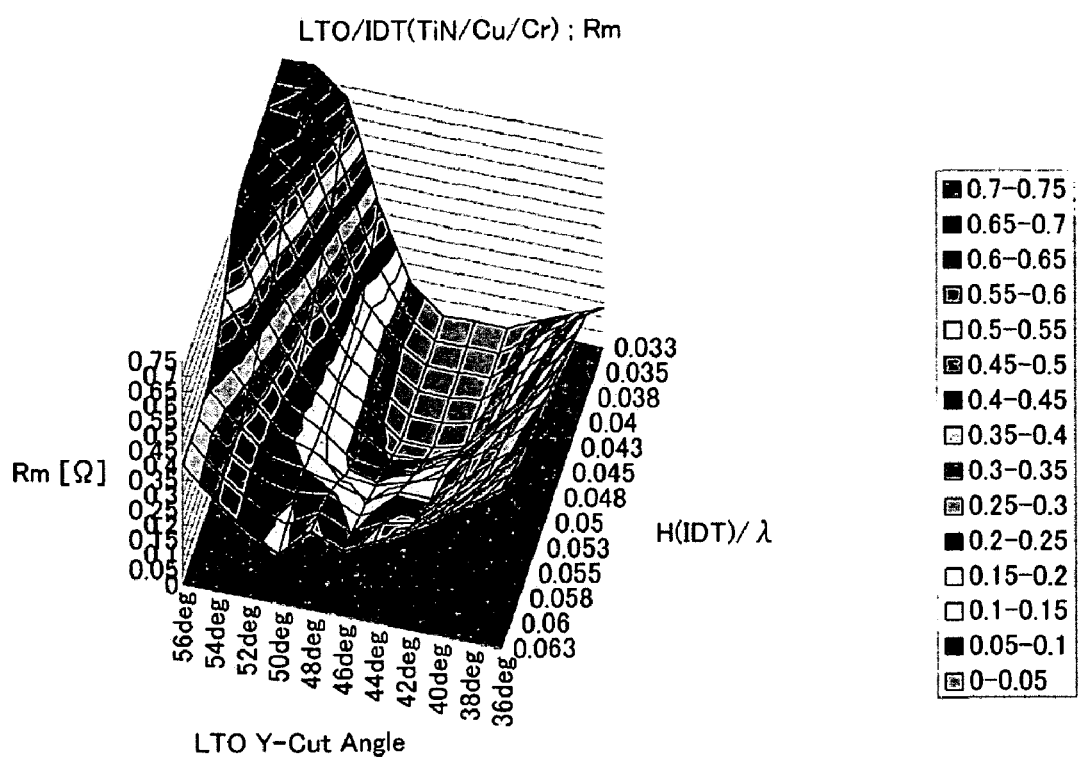
FIG. 75 is a graph showing an Rm of a resonator in which a surface acoustic wave device is formed by film-forming a main electrode layer made of a CuAg alloy on a piezoelectric substrate made of LiTaO$_3$, having a Y-cut angle changed, through a base layer TiN by means of a sputter method and by depositing a protective film Cr thereon.

FIGS. 73 to 75 are graphs respectively showing a reflection coefficient $S_{11}$, a bandwidth Δf, and an Rm of a resonator in which the surface acoustic wave device is formed by film-forming the main electrode layer (the film thickness of 80 nm) made of the CuAg alloy on the piezoelectric substrate made of $LiTaO_3$, having a Y-cut angle changed, through the base layer TiN (the film thickness of 5 nm) by means of the sputter method and by depositing the protective film Cr (the film thickness of 5 nm) thereon. Here, an expression of Rm=Rs−Re is satisfied, where Rs is an electrical resistance of the interdigital electrode section and the junction electrode section at 500 Hz and Re is a sum of the electrical resistance of the interdigital electrode section and a mechanical vibration loss at the resonant frequency fr.

The vertical axis of FIG. 73 represents the reflection coefficient $S_{11}$ measured at the antiresonant far in the resonator having the pair of interdigital electrodes (the crossed width 66 μm and 100 pairs).

The reflection coefficient $S_{11}$ is a parameter which defines the reflection of incident waves when a signal is applied between a signal input electrode and a ground electrode of the surface acoustic wave device resonator. In a case of an ideal resonator, the reflection coefficient $S_{11}$ is 1 at the resonant frequency. This means that, at the resonant frequency, the impedance is infinite and the Q-factor of the resonator is infinite. Thus, as the reflection coefficient $S_{11}$ is close to 1, the resonator is excellent.

The vertical axis of FIG. 74 represents the bandwidth Δf=(far−fr)/fr. The resonant frequency fr and the antiresonant frequency far of the surface acoustic wave device are measured by the network analyzer such as the MS4662A from Anritsu Company.

The reflection coefficient $S_{11}$ has the maximum value when the Y-cut angle is about 48°.

On the other hand, if the Y-cut angle of the $LiTaO_3$ substrate becomes large, the bandwidth Δf of the resonator narrows. Thus, the resonator deteriorates.

In order to obtain a desirable high frequency filter into which the resonator is incorporated, the bandwidth Δf of the resonator is preferably more than 3 percent. Specifically, the Y-cut angle of the $LiTaO_3$ substrate is preferably in a range of from 36° to 56°.

Further, as being apparent from the measurement result of the Rm, the Y-cut angle of the $LiTaO_3$ substrate is preferably in a range of from 40° to 50°.

A table 3 shows physical property data of metallic materials Cu, Al, Pt, Au, and Ag which can be used for the main electrode layer of the present invention, and physical property data of TiN (titanium nitride), Ni, Fe, Mg, Co, and Os which can be used for the base layer of the present invention and Ti, Ta, Mo, and Cr which can be used for the base layer of the present invention.

TABLE 3

| | Substrate | Main layer | | | | Base layer | |
|---|---|---|---|---|---|---|---|
| | LiTaO$_3$ Substrate | Al | Cu | Ag | Au | Pt | TiN |
| Crystal Structure | Trigonal | Face-Centered Cubic | Face-Centered Cubic | Face-Centered Cubic | Face-Centered Cubic | Face-Centered Cubic | Face-Centered Cubic |
| Lattice Constant [Å] | 5.514 (a axis) | 4.0496 | 3.615 | 4.0862 | 4.0785 | 3.924 | 4.22 |
| Resistivity [μΩ cm] | | 2.45 | 1.58 | 1.51 | 2.04 | 9.81 | 24.0 |
| Density [g/cm$^3$] | | 2.70 | 8.96 | 10.50 | 19.30 | 21.45 | 5.44 |
| Melting Point [° C.] | | 660 | 1083 | 961 | 1063 | 1769 | 3200 |
| Distance between atoms [Å] | a/2 (a axis) | 2.863 | 2.556 | 2.689 | 2.884 | 2.775 | 2.984 |
| Mismatch (TiN Based) | | −4.04 | −14.34% | −3.17% | −3.35% | −7.01% | (2.984) |
| Mismatch (Cu Based) | | | (2.556A) | | | | 16.74% |
| Mismatch (Al Based) | | (2.863A) | | | | | 4.21% |

| | Base layer | | | | | | | |
|---|---|---|---|---|---|---|---|---|
| | Ni | γFe | Co | Os (osmium) | Mg | Ti | Ta | Mo | Cr |
| Crystal Structure | Face-Centered Cubic | Face-Centered Cubic | Hexagonal Closest Packed | Hexagonal Closest Packed | Hexagonal Closest Packed | Hexagonal Closest Packed | Body-Centered Cubic | Body-Centered Cubic | Body-Centered Cubic |
| Lattice Constant [Å] | 3.524 | 3.847 | 4.070 | 4.319 | 5.210 | 4.683 | 3.303 | 3.142 | 2.885 |
| Resistivity [μΩ cm] | 6.9 | 9.8 | 7.0 | 9.5 | 4.5 | 47.8 | | | |
| Density [g/cm$^3$] | 8.85 | 7.86 | 8.90 | 22.57 | 1.741 | 4.51 | 16.64 | 10.22 | 7.19 |
| Melting Point [° C.] | 1455 | 1835 | 1492 | 2700 | 650 | 1668 | 2998 | 2620 | 1867 |
| Distance between atoms [Å] | 2.492 | 2.579 | 2.507 | 2.735 | 3.209 | 2.950 | 2.860 | 2.721 | 2.498 |
| Mismatch (TiN Based) | | | | | | | | | |
| Mismatch (Cu Based) | −2.51% | 0.88% | −1.92% | 7.00% | 25.55% | 15.41% | 11.90% | 6.45% | −2.26% |
| Mismatch (Al Based) | −12.98% | −9.95% | −12.44% | −4.48% | −12.06% | 3.02% | −0.11% | −4.97% | −12.75% |

In the present invention, it is important that materials having the face-centered cubic crystal structure are used for the main electrode layer and materials having the face-centered cubic crystal structure or the hexagonal closest-packed crystal structure are used for the base layer.

What is claimed is:

1. A surface acoustic wave device comprising a piezoelectric substrate and an electrode section having a thin-film structure formed on the piezoelectric substrate,
   wherein the electrode section has an interdigital electrode section and a junction electrode section connected to the interdigital electrode section,
   the interdigital electrode section has a base layer and a main electrode layer deposited on the base layer,
   the base layer has a sodium-chloride structure crystal structure, a face-centered cubic or a hexagonal closest-packed crystal structure and the main electrode layer has a face-centered cubic crystal structure, and
   a {111} plane of the main electrode layer has a constant gradient with respect to the substrate surface.

2. The surface acoustic wave device according to claim 1, wherein the {111} plane of the main electrode layer is parallel to an X-axis of crystals of the piezoelectric substrate.

3. The surface acoustic wave device according to claim 1, wherein a {111} plane of the base layer has a constant gradient with respect to the substrate surface.

4. The surface acoustic wave device according to claim 1, wherein crystals of the main electrode layer are epitaxially or heteroepitaxially grown on crystals of the base layer.

5. The surface acoustic wave device according to claim 1, wherein a spot position of a {111} plane in an X-ray diffraction (XRD) pole figure of crystals of the main electrode layer is aligned with a spot position of a {111} plane in an XRD pole figure of crystals of the base layer.

6. The surface acoustic wave device according to claim 1, wherein a pitch of the nearest neighbor atoms of crystals of the base layer is in a range of from 2.40 Å to 3.30 Å.

7. The surface acoustic wave device according to claim 1, wherein a pitch of the nearest neighbor atoms of crystals of the main electrode layer is in a range of from 2.50 Å to 3.00 Å.

8. The surface acoustic wave device according to claim 1, wherein a mismatch ratio between a pitch of the nearest neighbor atoms of crystals of the base layer and a pitch of the nearest neighbor atoms of crystals of the main electrode layer is in a range of from −20% to 20%, while satisfying an expression of the mismatch ratio= (pitch of the nearest neighbor atoms of the crystals of the base layer−pitch of the nearest neighbor atoms of the crystals of the main electrode layer)×100/(pitch of the nearest neighbor atoms of the crystals of the main electrode layer).

9. The surface acoustic wave device according to claim 8, wherein the mismatch ratio between the pitch of the nearest neighbor atoms of the base layer and the pitch of the nearest neighbor atoms of the crystals of the main electrode layer is in a range of from −15% to 15%.

10. The surface acoustic wave device according to claim 1, wherein the base layer is formed with one or more selected from the group consisting of TiN (titanium nitride), $TiO_xN_y$ (where 0<x<0.2, x+Y=1), Ni, Fe, Mg, Co, and Os.

11. The surface acoustic wave device according to claim 1, wherein the main electrode layer is formed with one or more selected from the group consisting of Cu, Al, Pt, Au, and Ag.

12. The surface acoustic wave device according to claim 1, wherein the main electrode layer is formed with an alloy of one or more elements selected from the group consisting of Cu, Al, Pt, Au, and Ag and one or more elements selected from the group consisting of Ag, Sn, C, Sc, and Cu.

13. The surface acoustic wave device according to claim 1, wherein the piezoelectric substrate has a trigonal crystal structure.

14. The surface acoustic wave device according to claim 1, wherein the piezoelectric substrate is made of $LiTaO_3$ or $LiNbO_3$.

15. The surface acoustic wave device according to claim 1, wherein the piezoelectric substrate is made of $LiTaO_3$ having a Y-cut angle ranging from 36° to 60°.

16. The surface acoustic wave device according to claim 15, wherein an angle from a substrate normal direction in a [111] direction of crystals of the main electrode layer is larger than an angle from the substrate normal direction in a Z-axis of the piezoelectric substrate.

17. The surface acoustic wave device according to claim 1, wherein a protective layer made of TiN (titanium nitride) or $TiO_xN_y$ (where 0<x<0.2, x+y=1) is deposited on the main electrode layer.

18. The surface acoustic wave device according to claim 1, wherein a film thickness of the base layer is in a range of from 5 nm to 20 nm.

* * * * *